(12) United States Patent
Ishibashi et al.

(10) Patent No.: US 10,008,380 B2
(45) Date of Patent: Jun. 26, 2018

(54) SUBSTRATE DRYING APPARATUS, SUBSTRATE DRYING METHOD AND CONTROL PROGRAM

(71) Applicant: EBARA CORPORATION, Tokyo (JP)

(72) Inventors: Tomoatsu Ishibashi, Tokyo (JP); Takahiro Ogawa, Tokyo (JP); Kenichi Sugita, Tokyo (JP); Shinji Kajita, Tokyo (JP); Koichi Fukaya, Tokyo (JP); Akira Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1066 days.

(21) Appl. No.: 14/287,616

(22) Filed: May 27, 2014

(65) Prior Publication Data

US 2014/0259728 A1 Sep. 18, 2014

Related U.S. Application Data

(62) Division of application No. 13/860,787, filed on Apr. 11, 2013, now Pat. No. 8,769,842, which is a division
(Continued)

(30) Foreign Application Priority Data

| Feb. 16, 2010 | (JP) | ................................. | 2010-031831 |
| Feb. 16, 2010 | (JP) | ................................. | 2010-031832 |
| Jan. 19, 2011 | (JP) | ................................. | 2011-009074 |

(51) Int. Cl.
| F26B 5/08 | (2006.01) |
| H01L 21/02 | (2006.01) |
| H01L 21/67 | (2006.01) |

(52) U.S. Cl.
CPC .. *H01L 21/02054* (2013.01); *H01L 21/02074* (2013.01); *H01L 21/67034* (2013.01)

(58) Field of Classification Search
CPC ......... H01L 21/02054; H01L 21/67028; H01L 21/67034; F26B 5/08
(Continued)

(56) References Cited

U.S. PATENT DOCUMENTS

| 6,770,151 B1 | 8/2004 | Ravkin et al. |
| 7,806,989 B2 | 10/2010 | Sekiguchi et al. |

(Continued)

FOREIGN PATENT DOCUMENTS

| JP | 10-172951 | 6/1998 |
| JP | 11-233481 | 8/1999 |

(Continued)

*Primary Examiner* — John McCormack
(74) *Attorney, Agent, or Firm* — Wenderoth, Lind & Ponack, L.L.P.

(57) ABSTRACT

A substrate drying apparatus includes a drying gas nozzle configured so that, assuming that a surface WA of the substrate W is a projection plane, regarding the drying gas flow Gf in the nozzle moving direction Dr, a collision position Gfw with the substrate W is located downstream of a projected discharge position Gfv', the projected discharge position Gfv' being a discharge position from the drying gas nozzle projected on the projection plane. In a three-dimensional space, the drying gas flow Gf is inclined, such that an angle α formed by an axis Ga of the drying gas flow Gf and a vertical line Wp of the substrate W is in a range from a half contact angle $\theta/2$ to an angle determined by deducting the half contact angle $\theta/2$ from 90°, the half contact angle $\theta/2$ being a half of the contact angle $\theta$.

26 Claims, 14 Drawing Sheets

Related U.S. Application Data of application No. 13/022,979, filed on Feb. 8, 2011, now abandoned.

(58) Field of Classification Search
USPC ... 34/312, 325, 329, 330, 357, 487, 510, 58, 34/85, 241; 134/26, 27, 32, 33, 34
See application file for complete search history.

(56) References Cited

U.S. PATENT DOCUMENTS

| | | |
|---|---|---|
| 7,980,255 B2 | 7/2011 | Achkire et al. |
| 8,303,724 B2 | 11/2012 | Hiroshiro et al. |
| 2007/0044823 A1 | 3/2007 | Yamamoto et al. |
| 2007/0107253 A1 | 5/2007 | Nishiura |
| 2008/0244925 A1 | 10/2008 | Shin |
| 2008/0314870 A1 | 12/2008 | Inoue et al. |

FOREIGN PATENT DOCUMENTS

| | | |
|---|---|---|
| JP | 2005-038963 | 2/2005 |
| JP | 2006-501693 | 1/2006 |
| JP | 2007-36180 | 2/2007 |
| JP | 2008-016642 | 1/2008 |
| WO | 99/16109 | 4/1999 |
| WO | 2004/030051 | 4/2004 |
| WO | 2006/082780 | 8/2006 |

SUBSTRATE DRYING APPARATUS, SUBSTRATE DRYING METHOD AND CONTROL PROGRAM

BACKGROUND OF THE INVENTION

1. Technical Field

The present invention relates to a substrate drying method, a control program and a substrate drying apparatus, and more particularly to a substrate drying apparatus which can efficiently dry a substrate after cleaning, a substrate drying method which can inhibit occurrence of defects, and a control program and the substrate drying apparatus which execute the substrate drying method.

2. Related Art

With a background of recent request for miniaturization of a semiconductor device, copper with less resistance has been used as a wiring material. Generally, copper wiring is formed by steps of forming a groove on an insulation film formed on a surface of a substrate, embedding copper in the groove, and shaving redundant copper by chemical mechanical polishing (CMP). The substrate after polishing by CMP is dried after wet cleaning. In the wet cleaning, if drying is started from a state that liquid is attached to the substrate in a mottle fashion, defects such as a watermark (water stain) tend to occur.

Under such circumstances, as an effective drying method for inhibiting occurrence of the defects, there is a method of single wafer process in which a liquid flow of rinse agent for cleaning is supplied on the rotating substrate to form a liquid film covering the entire substrate and a gas flow for drying the substrate containing IPA (isopropyl alcohol) which reduces surface tension of the rinse agent is supplied to the inside of the liquid flow, and by moving a liquid flow nozzle and a gas flow nozzle from the center to the outer periphery of the rotating substrate, the rinse agent is moved to the outer periphery side due to centrifugal force and Marangoni force such that a region to be dried on the substrate is gradually spread from the center to the outer periphery, and finally, the entire surface of the substrate is dried (hereinafter, the method is referred to as "single wafer IPA drying"). At this time, for the purpose of obtaining an effective Marangoni effect, in order to increase IPA dissolved in the rinse agent, increasing a supply amount of IPA appropriately or raising the temperature of gas containing the IPA has been executed for example, see International Patent Application Publication No. 2006/082780, paragraphs 0135 to 0137, etc.).

However, when a supply amount of IPA is increased appropriately or the temperature of gas containing IPA is raised in order to increase IPA dissolved in the rinse agent, the apparatus configuration and control of the apparatus become complicated.

Considering the above problem, an object of the present invention is to provide a substrate drying apparatus which increases a substance dissolved in rinse agent for reducing surface tension of the rinse agent in a relatively convenient manner and executes efficient drying of the substrate after cleaning.

On the other hand, as an insulation film, in which copper is embedded, on a surface of the substrate, a material whose k value (relative permittivity) is low (a Low-k film) is used from a viewpoint of reducing condenser capacity formed between the wiring. Since the Low-k film is hydrophobic, a water film on the substrate tends to be divided in cleaning after polishing, and defects such as a watermark (water stain) tend to occur if drying is executed in a state that the water film is divided.

Under such circumstances, as an effective drying method for inhibiting occurrence of defects, there is a method of single wafer process in which a liquid flow of rinse agent for cleaning is supplied on the rotating substrate to form a liquid film covering the entire substrate and a gas flow for drying the substrate containing IPA (isopropyl alcohol) which reduces surface tension of the rinse agent is supplied to the inside of the liquid flow, and by moving a liquid flow nozzle and a gas flow nozzle from the center to the outer periphery of the rotating substrate, the rinse agent is moved to the outer periphery side due to centrifugal force and Marangoni force such that a region to be dried on the substrate is gradually spread from the center to the outer periphery, and finally, the entire surface of the substrate is dried (hereinafter, the method is referred to as "single wafer IPA drying").

FIG. 14 shows the relationship between IPA concentration of a drying gas flow and an amount of generated watermarks of 0.15 µm or more grasped so far. Additionally, FIG. 14 is a graph showing a result of single wafer IPA drying executed to the substrate which has the k value (relative permittivity) of 2.9 and which a copper circuit is formed on the surface (pattern wafer). In the single wafer IPA drying, an amount of IPA in the drying gas flow is maintained at a constant value (2 mol % or more based on actual performance shown in FIG. 14) until a gas nozzle reaches approximately half of a radius of the substrate, and is increased toward the outer periphery in which an area to remove a liquid film becomes larger. (For example, see International Patent Application Publication No. 2006/082780, paragraph 0159 and FIG. 6).

However, in the drying method described above (a method of maintaining IPA in the gas flow at 2 mol % or more over the entire substrate), regarding defects on the substrate such as a foreign matter, a scar, and a watermark (water stain) which can affect a product, a defect of less than 0.15 µm, 0.10 µm for example, can be detected as one because its size requires verification in accordance with recent advancement of the semiconductor technology although it has been passed over under the conventional standard in which the detection size of 0.15 µm or more is targeted, and as a result, it is found that a number of defects have occurred.

Considering the above, an object of the present invention is to provide a substrate drying method which can inhibit occurrence of defects, and a control program and a substrate drying apparatus which execute the substrate drying method.

SUMMARY OF THE INVENTION

To achieve the above object, a substrate drying apparatus according to aspect (1) of the present invention comprises, as shown in FIGS. 1A and 1B for example, a rotation mechanism 10 for rotating a substrate W in a horizontal plane, the substrate W having a surface WA whose contact angle to rinse agent is 90° or less; a rinse agent nozzle 20 for supplying a rinse agent flow Rf on the surface WA of the rotating substrate W, the rinse agent flow Rf being a flow of the rinse agent R; a rinse agent nozzle moving mechanism 40 for moving the rinse agent nozzle 20 in a nozzle moving direction Dn extending from a side of a rotation center Wc toward a side of an outer periphery of the rotating substrate W; a drying gas nozzle 30 for supplying a drying gas flow Gf on a downstream side in a substrate rotation direction Dr and on the side of the rotation center Wc of the substrate W with respect to a position Rt (see FIGS. 4A through 5B, for example) of the rotating substrate W at which the rinse agent flow Rf is supplied, the drying gas flow Gf containing a substance reducing surface tension of the rinse agent R, the substrate rotation direction Dr in which the rinse agent flows Rf when the substrate W is rotating; and a drying gas nozzle moving mechanism 40 for moving the drying gas nozzle 30 in the nozzle moving direction Dr, wherein the drying gas nozzle 30 is provided such that, assuming that a surface WA of the substrate W is a projection plane, regarding the drying gas flow Gf in the nozzle moving direction Dr, a collision position Gfw with the substrate W is located downstream of a projected discharge position Gfv' (see FIGS. 4B and 5B, for example), the projected discharge position Gfv' being a discharge position from the drying gas nozzle 30 projected on the projection plane, and in a three-dimensional space, the drying gas flow Gf is inclined, such that an angle α formed by an axis Ga of the drying gas flow Gf and a vertical line Wp of the substrate W is in a range from a half contact angle θ/2 to an angle determined by deducting the half contact angle θ/2 from 90°, the half contact angle θ/2 being a half of the contact angle θ (see FIG. 2, for example). Here, IPA is typically listed as a substance which reduces surface tension of the rinse agent. Moreover, the rinse agent flow is typically formed narrow to an area of the surface of the substrate. Further, the description that "assuming that a surface of the substrate is a projection plane" means that projection is executed vertically to the surface of the substrate. In addition, a lower limit of the contact angle of the targeted substrate is typically an angle formed by a surface of a film of the rinse agent having a minimum thickness and the surface of the substrate.

With this configuration, the drying gas flow colliding with the substrate is not equally diffused radially and it inhibits the drying gas from flowing into an already dried region. Accordingly, the substance dissolved in the rinse agent for reducing surface tension of the rinse agent can be increased and the drying gas draws out the rinse agent to make the film of the rinse agent covering the substrate thin, which achieves reduction of a drying load and an effective drying of the substrate after cleaning. Moreover, when the drying gas flow is located adjacent to the rotation center of the substrate, a flow of the rinse agent can be generated even in a rotation center portion in which a relative speed cannot be obtained to eliminate a sluggish flow portion of the rinse agent, so that drying of the rotation center portion can be executed easily.

According to aspect (2) of the present invention, as shown in FIGS. 1A, 1B, 5A and 5B (7A and 7B) for example, in the substrate drying apparatus according to the aspect (1), the drying gas G is supplied more on the downstream side than on the upstream side in the substrate rotation direction Dr with a boundary of a virtual line extending in the nozzle moving direction Dn in a range Gft (Gft, Gst) in which drying gas G supplied from the drying gas nozzle 302 (30, 36) substantially acts on a rinse agent collision range Rt in which the rinse agent flow Rf collides with the substrate W. Here, the range in which the drying gas substantially acts is typically a range in which one of effects of the drying gas, which is reduction of surface tension of the rinse agent, is exerted to an expected extent.

This configuration achieves that an effect of the drying gas can be exerted in a wider range to the rinse agent supplied to the surface and drawn out in accordance with rotation of the substrate.

According to aspect (3) of the present invention, as shown in FIGS. 5A and 5B for example, in the substrate drying apparatus according to the aspect (2), the drying gas nozzle 302 is provided such that, regarding the drying gas flow Gf in the substrate rotation direction Dr, the collision position Gfw with substrate W is located downstream of on the projected discharge position Gfv'.

This configuration achieves that an effect of the drying gas can be exerted in a wider range to the rinse agent drawn out in accordance with rotation of the substrate in a simple apparatus configuration.

According to aspect (4) of the present invention, as shown in FIGS. 7A and 7B for example, the substrate drying apparatus according to the aspect (2) further comprises an additional drying gas nozzle 36 for supplying an additional drying gas flow Gs to the rotating substrate W, the additional drying gas nozzle 36 being different from the drying gas nozzle 30 and being provided such that, regarding the additional drying gas flow Gs in the substrate rotation direction Dr, a collision position Gsw with the substrate W is located downstream of an additional projected discharge position Gsv', the additional projected discharge position Gsv' being an additional discharge position from the additional drying gas nozzle 36 projected on the projection plane.

This configuration achieves that an effect of the drying gas can be exerted in a further wider range on the rinse agent.

To achieve the above object, a substrate drying apparatus according to aspect (5) of the present invention comprises, as shown in FIGS. 1A, 1B, 5A and 5B for example, a rotation mechanism 10 for rotating a substrate W in a horizontal plane; a rinse agent nozzle 20 for supplying a rinse agent flow Rf to the rotating substrate W; a rinse agent nozzle moving mechanism 40 for moving the rinse agent nozzle 20 in a nozzle moving direction Dn extending from a side of a rotation center Wc toward a side of an outer periphery of the rotating substrate W; a drying gas nozzle 30 for supplying a drying gas flow Gf on a downstream side in a substrate rotation direction Dr and on the side of the rotation center Wc of the substrate W with respect to a position of the rotating substrate at which the rinse agent flow Rf is supplied, the drying gas flow Gf containing a substrate reducing surface tension of the rinse gent R, the substrate rotation direction Dr in which the rinse agent R flows when the substrate W is rotating; and a drying gas nozzle moving mechanism 40 for moving the drying gas nozzle 30 in the nozzle moving direction Dn, wherein the drying gas nozzle 30 is provided such that, assuming that a surface WA of the substrate W is a projection plane, regarding the drying gas flow Gf in the nozzle moving direction Dn and the substrate rotation direction Dr, a collision position Gfw (see FIG. 5B, for example) with the substrate W is located downstream of a projected discharge position Gfv' (see FIG. 5B, for example), the projected discharge position Gfv' being a discharge position from the drying gas nozzle 30 projected on the projection plane, and in this state, an angle formed by an axis Gs of the drying gas flow Gf and the nozzle moving direction Dn is a predetermined turning angle β, and in a three-dimensional space, the drying gas flow Gf is inclined, such that an angle formed by an axis Ga of the drying gas flow Gf and a vertical line of the substrate W is at a predetermined inclined angle α.

With this configuration, assuming that a surface of the substrate is a projection plane, regarding the drying gas flow in the nozzle moving direction and the substrate rotation direction, a collision position with the substrate is located downstream of a projected discharge position, the projected discharge position being a discharge position from the drying gas nozzle projected on the projection plane, and in this state, an angle formed by an axis of the drying gas flow and the nozzle moving direction is a predetermined turning angle, and in a three-dimensional space, the drying gas flow is inclined, such that an angle formed by an axis of the drying gas flow and a vertical line of the substrate is at a predetermined inclined angle. This inhibits the drying gas from flowing into an already dried region, the substance dissolved in the rinse agent for reducing surface tension of the rinse agent can be increased and the drying gas draws out the rinse agent to make the film of the rinse agent covering the substrate thin, which achieves reduction of a drying load and an effective drying of the substrate after cleaning.

To achieve the above object, a substrate drying method according to aspect (6) of the present invention, as shown in FIGS. 8A, 8B, 10, 11A and 13A for example, the method supplying a substrate rotating in a horizontal plane with a rinse agent flow and a drying gas flow while the rinse agent flow and the drying gas flow are moved from the center side toward an outer periphery side of the rotating substrate, the drying gas flow being able to contain IPA, comprises the steps of: a center area drying step of drying a center area W1 of the substrate W, the center area W1 being a range where a rotation center Wc of the substrate W exists in a collision range of the drying gas flow Gf with the substrate W; and an outer periphery area drying step of drying an outer periphery area W3 existing outside of the center area W1 of the substrate W; wherein an IPA concentration of the IPA contained in the drying gas flow Gf is maintained at less than 2 mol % during the center area drying step, and the IPA concentration is adjusted higher in the outer periphery area drying step than in the center area drying step. The IPA typically functions to reduce surface tension of the rinse agent to obtain a Marangoni effect.

This configuration inhibits occurrence of defects even when the rinse agent is evaporated in the center area in which the rinse agent tends to remain due to a relatively small centrifugal force.

To achieve the above object, a substrate drying method according to aspect (7) of the present invention, as shown in FIGS. 8A, 8B, 10, 11A and 13A for example, the method supplying a substrate rotating in a horizontal plane with a rinse agent flow and a drying gas flow while the rinse agent flow and the drying gas flow are moved from the center side toward an outer periphery side of the rotating substrate, the drying gas flow being able to contain IPA, comprises the steps of: a center area drying step of drying a center area W1 of the substrate W, the center area W1 being a range where a rotation center Wc of the substrate W exists in a collision range of the drying gas flow Gf with the substrate W; and an outer periphery area drying step of drying an outer periphery area W3 existing outside of the center area W1 of the substrate W; wherein an IPA concentration of the IPA contained in the drying gas flow Gf is maintained at a concentration substantially preventing a Marangoni effect during the center area drying step, and the IPA concentration is adjusted to a concentration generating a Marangoni effect during the outer periphery drying step. Here, the Marangoni effect is an effect in which a flow of fluid is driven by heterogeneity of surface tension of a fluid surface, and also called as Marangoni convection. Moreover, the matter that Marangoni effect substantially does not occur is typically a state that an effect to the expected extent is not generated in view of the purpose of removing the rinse agent.

This configuration inhibits occurrence of defects even when the rinse agent is evaporated in the center area in which the rinse agent tends to remain due to a relatively small centrifugal force.

According to aspect (8) of the present invention, as shown in FIGS. 8A, 8B and 13A for example, in the substrate drying method according to the aspect (6) or (7), the concentration of the IPA contained in the drying gas flow Gf is adjusted gradually higher when the concentration increases from one in the center area (W1) drying step to one in the outer periphery area (W3) drying step. Typically, IPA concentration contained in the drying gas flow Gf is gradually increased from a portion which is located about 5 mm or more toward the rotation center Wc from the outer periphery area W3 when the IPA concentration is raised from one in the center area drying step to one in the outer periphery area drying step.

This configuration gradually reduces surface tension of a contact portion of the rinse agent supplied to the substrate with the drying gas flow, which makes a drying state of the substrate stable and inhibits occurrence of defects.

According to aspect (9) of the present invention, as shown in FIGS. 8A, 8B and 11A for example, in the substrate drying method according to any one of the aspects (6) to (8), a moving speed of the rinse agent flow Rf and the drying gas flow Gf is maintained constant in a step of drying a substrate W from its rotation center Wc to its outer peripheral end including the center area drying step and the outer periphery area drying step.

This configuration inhibits occurrence of defects since there is no change in moving speed of the rinse agent flow and drying gas flow which tend to generate the defects.

According to aspect (10) of the present invention, as shown in FIGS. 8A, 8B and 11B for example, in the substrate drying method according to any one of the aspects (6) to (8), a moving speed of the rinse agent flow Rf and the drying gas flow Gf is increased during the center area drying step or immediately after the center area drying step is terminated. In the single wafer IPA drying, firstly the drying gas flow is supplied to the rotation center of the substrate covered by the rinse agent to form a dry spot which is a dried region on the rotation center of the substrate, and the dry spot is spread toward the outer periphery while the rinse agent flow and the drying gas flow are moved toward the outer periphery to dry the substrate. On the other hand, in the substrate drying method according to the aspect (10) of the present invention, typically, the rinse agent flow and the drying gas flow are moved in a relatively slow speed immediately after the start of the moving until a dry spot is formed, and after the dry spot is formed, a moving speed of the rinse agent and the drying gas flow is increased.

With this configuration, the rinse agent which tends to remain surrounding a collision range of the drying gas flow when supply of the drying gas flow is started can be appropriately eliminated, and throughput (productivity or processing capability per unit time) in accordance with increase of a moving speed of the rinse agent flow and the drying gas flow can be improved while occurrence of defects in the center area is inhibited.

According to aspect (11) of the present invention, as shown in FIGS. 8A, 8B and 11A for example, in the substrate drying method according to any one of the aspects (6) to (10), a rotating speed of the substrate W is not decreased in a step of drying a substrate W from its rotation center Wc to its outer peripheral end including the center area drying step and the outer periphery area drying step.

This configuration prevents that surface tension of the rinse agent is relatively larger than a centrifugal force in the outer periphery area in which an amount of the rinse agent per unit area tends to be insufficient, and inhibits occurrence of defects due to turbulence of a surface of the rinse agent covering the substrate.

A control program according to aspect (12) of the present invention, referring to FIG. 8A for example, is installed in a computer 50 connected to a substrate drying apparatus and the computer controls the substrate drying apparatus, and the control program 50 controls the substrate drying apparatus which executes the substrate drying method according to any one of the aspects (6) to (11).

With this configuration, a control program applicable to the substrate drying apparatus which executes drying of the substrate while occurrence of defects is inhibited even when the rinse agent is evaporated in the center area in which the rinse agent tends to remain due to a relatively small centrifugal force.

A substrate drying apparatus according to aspect (13) of the present invention comprises, as shown in FIGS. 8A and 8B for example, a rinse agent nozzle 20 for discharging rinse agent R to be supplied to a substrate W; a rinse agent nozzle moving mechanism 40 for moving the rinse agent nozzle 20; a drying gas nozzle 30 for discharging a drying gas flow Gf to be supplied to the substrate W; a drying gas nozzle moving mechanism 40 for moving the drying gas nozzle 30; a rotation mechanism 10 for rotating the substrate W in a horizontal plane; and a controller 50 having a computer in which the control program according to the aspect (12) is installed.

This configuration achieves the substrate drying apparatus which executes drying of the substrate while occurrence of defects is inhibited even when the rinse agent is evaporated in the center area in which the rinse agent tends to remain due to a relatively small centrifugal force.

According to the aspects (1) to (5), the drying gas flow colliding with the substrate is not equally diffused radially and it inhibits the drying gas from flowing into an already dried region. Accordingly, the substance dissolved in the rinse agent for reducing surface tension of the rinse agent can be increased and the drying gas draws out the rinse agent to make the film of the rinse agent covering the substrate thin, which achieves reduction of a drying load and an effective drying of the substrate after cleaning.

According to the aspects (6) to (13), these inhibit occurrence of defects even when the rinse agent is evaporated in the center area in which the rinse agent tends to remain due to a relatively small centrifugal force.

DETAILED DESCRIPTION OF THE PREFERRED EMBODIMENT

Figure 1A:
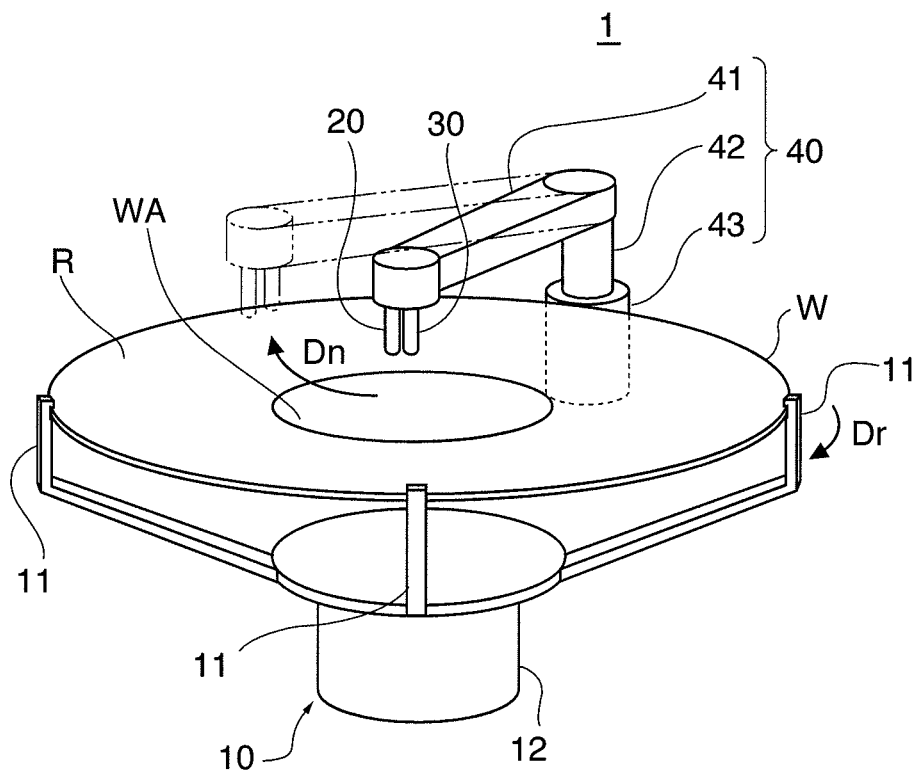
FIG. 1A is a perspective view showing a schematic configuration of a substrate drying apparatus according to the first embodiment of the present invention.

This application is based on the Patent Applications No. 2010-031831 filed on Feb. 16, 2010 in Japan, Patent Applications No. 2010-031832 filed on Feb. 16, 2010 in Japan and Patent Applications No. 2011-009074 filed on Jan. 19, 2011 in Japan, the contents of which are hereby incorporated in its entirety by reference into the present application, as part thereof.

The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same reference numerals in all the drawings, and their descriptions are not repeated.

Figure 1B:
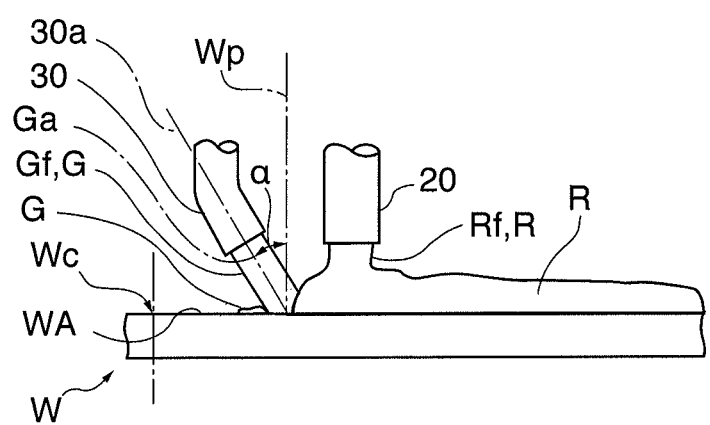
FIG. 1B is a partially enlarged side view of a tip of a nozzle and its surroundings of the substrate drying apparatus according to the first embodiment of the present invention.

First, with reference to FIGS. 1A and 1B, a substrate drying apparatus 1 according to the first embodiment of the present invention will be explained. FIG. 1A is a perspective view showing a schematic configuration of the substrate drying apparatus 1, and FIG. 1B is a partially enlarged side view of a tip of a nozzle and its surroundings of the substrate drying apparatus 1. The substrate drying apparatus 1 comprises a rotation mechanism (structure) 10 that rotates a substrate W to be processed, a rinse water nozzle 20 as a rinse agent nozzle that supplies the substrate W with rinse water R as rinse agent, a drying gas nozzle 30 that supplies the substrate W with drying gas G, and a movement mechanism 40 that moves the rinse water nozzle 20 and the drying gas nozzle 30 in parallel with a surface of the substrate W. In this embodiment, the movement mechanism 40 functions as both a rinse agent nozzle movement mechanism and a drying gas nozzle movement mechanism.

Typically, the substrate W to be processed is a semiconductor substrate which is a material for manufacture of a semiconductor device and formed to be disk-shaped. The substrate W has one surface on which a circuit is formed (this surface is called as "a topside surface WA"), while no circuit is represented on the other surface (backside surface). Recently, in the semiconductor substrate, copper with relatively less resistance has been used as a wiring material. The copper wiring is generally formed by forming a groove on an insulation film formed on a topside surface of a substrate, embedding copper in the groove, and then shaving redundant copper by CMP. For the insulation film in which the copper is embedded, a material whose k value (relative permittivity) is low (Low-k film) is used from a viewpoint of reducing condenser capacity formed between wiring. In this embodiment, an explanation will be made assuming that the substrate W, in which the Low-k film having the k value of approximately 3.0 or less (typically, an SiOC film) is formed, is used. Typically, as a Low-k film is hydrophobic, a rinse water film on the substrate W tends to be divided in cleaning after polishing, and there is a possibility of occurrence of defects such as a watermark and a crack if drying is executed in a state that the rinse water film is divided. Moreover, a hydrophobic Low-k film has tendency that a rinse water film covering this Low-k film is made thick, and thus a load in drying becomes relatively large. In single wafer IPA drying, an appropriate drying process can be executed also to the substrate W having a hydrophobic topside surface. As one indicator of wet property of a surface of the substrate W (a degree of hydrophobicity), a contact angle is used.

Figure 2:
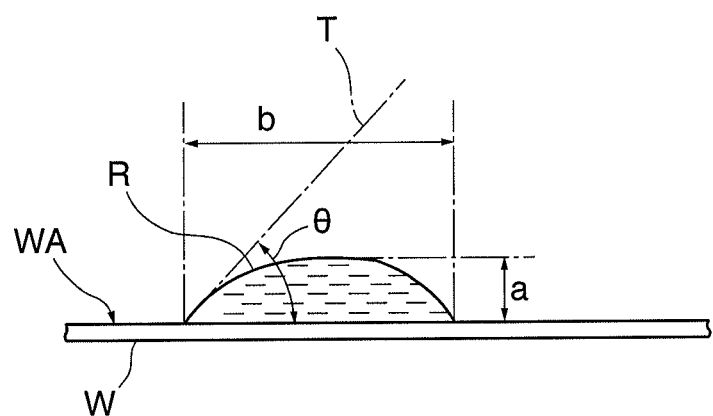
FIG. 2 is a drawing illustrating a contact angle of liquid to a plane.

Here, the contact angle will be explained with reference to FIG. 2. In this embodiment, the contact angle is an angle formed by a tangent line T of a droplet of the rinse water R, which is dropped on the topside surface WA of the substrate W, and the topside surface WA of the substrate W, which corresponds to θ in FIG. 2. Wet property (ease of wetting) of the topside surface WA is evaluated by the contact angle θ. That is, when compositions of contacting liquid are in common, it can be said, the smaller the contact angle is, the higher ease of wetting of the topside surface WA is (high hydrophilicity), while the larger the contact angle θ is, the lower ease of wetting of the topside surface WA is (high hydrophobicity). In this embodiment, the contact angle θ is a static contact angle on the premise that the droplet of the rinse water R rests still on the topside surface WA. In other words, it is not a dynamic contact angle in which a boundary surface between the rinse water R and the topside surface WA is moving. In this embodiment, the contact angle θ is specified by estimate assuming that a gas-liquid boundary (outline) in a vertical cross section of the droplet of the rinse water R is a part of a circle, and if the outline of the droplet has a height (a) and the width (b), the contact angle $θ=2×\tan^{-1}(2a/b)$. Generally, a contact angle to water of a Low-k film is reduced by approximately half when CMP is executed. In this embodiment, the substrate W to be processed has a contact angle to a droplet of the rinse water R of the topside surface WA of 90° or less (the lower limit of the contact angle is an angle formed by a film surface of the rinse water R having the minimum thickness and the topside surface WA), and typically, it is a substrate whose contact angle is reduced to approximately 25° to 60° after CMP.

Returning to FIGS. 1A and 1B again, an explanation of the configuration of the substrate drying apparatus 1 will be continued. The rotation mechanism 10 has a chuck claw 11 and a rotation driving shaft 12. A plurality of chuck claws 11 are provided to grasp an outer peripheral end (edge portion) of the substrate W and to hold the substrate W. Each chuck claw 11 is connected to the rotation driving shaft 12 so that the plurality of chuck claws 11 can hold the substrate W in a state where the surface of the substrate W is horizontal. In this embodiment, the substrate W is held by the chuck claws 11 such that the topside surface WA faces upward. The rotation driving shaft 12 can rotate around an axis extending perpendicular to the surface of the substrate W. The rotation driving shaft 12 is made so that the substrate W can be rotated in a horizontal plane by rotation of the rotation driving shaft 12 around the axis.

The rinse water nozzle 20 is a nozzle (a cylindrical apparatus that discharges fluid from its tip pore) that supplies the substrate W with the rinse water R for covering an upper surface of the substrate W with a liquid film in a state of a water flow (rinse water flow Rf) in order to avoid occurrence of defects such as a watermark caused by the matter that liquid on the topside surface WA of the substrate W is dried from a state of droplets. The rinse water R is typically pure water, but deionization water in which dissolved salt or dissolved organic substances are removed, carbon dioxide dissolved water, and function water (such as hydrogen water and electrolytic ionized water) etc. may be used. From a viewpoint of eliminating dissolved salt or dissolved organic substances which are a cause of occurrence of a watermark, deionization water is preferably used. Moreover, based on the matter that occurrence of static electricity caused by movement of the rinse water R on the substrate W by rotation of the substrate W attracts foreign objects, from a viewpoint of increasing of conductivity of the rinse water R to inhibit electrostatic charge, carbon dioxide dissolved water is preferably used. As the substrate W to be processed, there is one having a diameter of 200 mm to 300 mm to 450 mm, and an inner diameter of the rinse water nozzle 20 that forms the rinse water flow Rf may be selected appropriately between the diameters of 1 mm and 10 mm, or 3 mm and 8 mm. The diameter of the rinse water flow Rf discharged from the rinse water nozzle 20 to collide with the topside surface WA of the substrate W, (the diameter of rinse water collision range Rt described later), is approximately the same as the inner diameter of the rinse water nozzle 20.

The drying gas nozzle 30 is a nozzle that supplies a substance that reduces surface tension of the rinse water R to a film of the rinse water R covering the topside surface WA of the substrate W and supplies the substrate W with drying gas G that pushes away the film of the rinse water R in a state of a gas flow (drying gas flow Gf). In this embodiment, an explanation is made assuming that IPA is used as a substance that reduces the surface tension of the rinse water R; however, other than IPA, a substance of ethylene glycol system or propylene glycol system, surfactant and the like, which are expected to have an effect of reducing surface tension of the rinse water R, may be used. Typically, the drying gas G is made by mixing IPA vapor with inactive gas such as nitrogen and argon which function as carrier gas; however, it may be IPA vapor itself. As the substrate W to be processed, there is one having a diameter of 200 mm to 300 mm to 450 mm, and an inner diameter of the drying gas nozzle 30 that forms the drying gas flow Gf may be selected appropriately between 3 mm and 10 mm, or 4 mm and 8 mm. An inner diameter of the drying gas nozzle 30 may be the same as or different from the diameter of the rinse water nozzle 20. The diameter of the drying gas flow Gf discharged from the drying gas nozzle 30 to collide with the topside surface WA of the substrate W is approximately the same as the inner diameter of the drying gas nozzle 30. The thickness of the drying gas flow Gf is set to be appropriate for single wafer IPA drying.

More specifically, as shown in FIG. 1B, in the present embodiment the rinse water nozzle 20 extends perpendicularly to the topside surface WA to supply the rinse water flow Rf vertically to the topside surface WA. The axis 30a of a discharge port of the drying gas nozzle 30 is inclined with respect to the vertical line Wp on a collision position of the drying gas flow Gf of the topside surface WA. Since the drying gas nozzle 30 is thus provided, the drying gas flow Gf discharged from the drying gas nozzle 30 collides with the topside surface WA in a state that the drying gas flow axis Ga, which is the axis of the drying gas flow Gf, (the axis assuming that the drying gas flow Gf is a tube, and it is on the extending line of the axis 30a), is inclined with respect to the vertical line Wp of the topside surface WA. The drying gas nozzle 30 is mounted to a movable arm 41 so that an inclined angle α which is defined as the angle between the drying gas flow axis Ga and the vertical line Wp is greater than or equal to a half contact angle θ/2 which is a half angle of the contact angle θ (see FIG. 2) of the rinse water R on the topside surface WA and smaller than or equal to 90° minus the half contact angle θ/2 ($\theta/2 \leq \alpha \leq (90° - \theta/2)$). Since the drying gas flow Gf is inclined to the vertical line Wp, an outline (contour) of the drying gas flow Gf formed by colliding with the topside surface WA become an oval elongated in the moving direction of the nozzle.

The movement mechanism 40 includes a movable arm 41, a movable shaft 42 and a driving source 43. The movable arm 41 is a member which has a larger length than a radius of the substrate W and to which the rinse water nozzle 20 and the drying gas nozzle 30 are mounted. The movable shaft 42 is a rod member that transmits power of the driving source 43 to the movable arm 41, having one end connected to an end of the movable arm 41 in a state where its longitudinal direction is perpendicular to the longitudinal direction of the movable arm 41 and the other end connected to an end of the driving source 43. The driving source 43 is an apparatus that pivots the movable shaft 42 around the axis. The movable shaft 42 is provided to extend vertically on the outer side of the substrate W. The movable arm 41 is configured so that the drying gas flow Gf discharged from the drying gas nozzle 30 attached on the opposite side of a connected end to the movable shaft 42 can collide with the rotation center Wc of the substrate W. The movement mechanism 40 is configured such that, when the driving source 43 is operated, the movable arm 41 is moved in the radial direction of the substrate W via the movable shaft 42, and in accordance with the movement of the movable arm 41, the rinse water nozzle 20 and the drying gas nozzle 30 are moved in the radial direction of the substrate W.

Figure 3A:
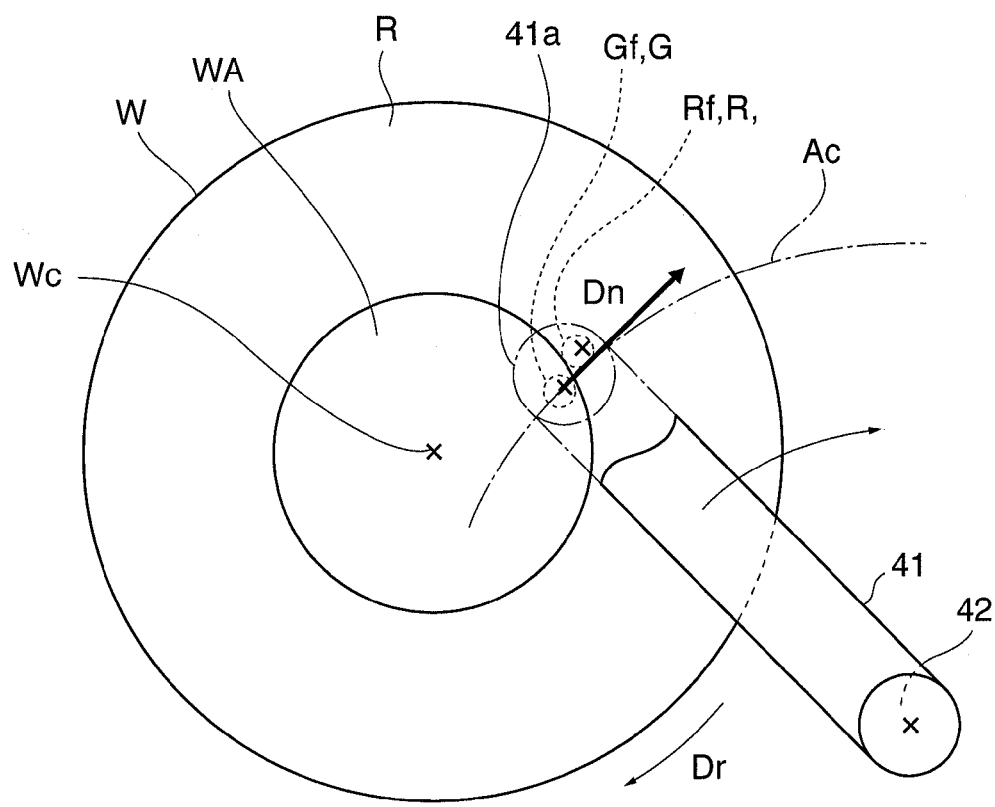
FIG. 3A is a plan view of a movement mechanism and its surroundings of the substrate drying apparatus illustrating the positional relationship between rinse water and drying gas to be supplied to the substrate and their moving direction.

With reference to FIG. 3A which is a plan view of the movement mechanism 40 and its surroundings, a moving direction of the rinse water nozzle 20 (see FIGS. 1A and 1B) and the drying gas nozzle 30 (hereinafter, in this paragraph, they are simply referred to as "an arm tip 41a") (this direction is referred to as "nozzle moving direction Dn") will be explained. The nozzle moving direction Dn is a moving direction of the arm tip 41a when a single wafer IPA drying is executed, that is, the rinse water R and the drying gas G are supplied to the topside surface WA of the substrate W, and this direction is directed from the rotation center Wc of the substrate W to the outer periphery. After the single wafer IPA drying, the movable arm 41 swings back to the rotation center Wc of the substrate W to be processed next. However, when the arm tip 41a returns to the rotation center Wc from the outer periphery of the substrate W, as no rinse water R and drying gas G are supplied to the topside surface WA, the returning direction is not the nozzle moving direction Dn. In addition, even when the nozzle moving direction Dn is directed to the outer periphery from the rotation center Wc of the substrate W, strictly speaking, in a plan view (FIG. 3A), the arm tip 41a moves on a virtual arc Ac whose radius is a distance from the axis of the movable shaft 42 to the arm tip 41a centered at the axis of the movable shaft 42, so that the nozzle moving direction Dn is not an invariable straight line direction to the substrate W. Consequently, on the tangent line of the virtual arc Ac, the direction from the rotation center Wc of the substrate W to the outer periphery is referred to as the nozzle moving direction Dn. That is, the nozzle moving direction Dn relative to the substrate W can be changed continually. On the other hand, the nozzle moving direction Dn relative to the moving movable arm 41 is invariable.

Figure 3B:
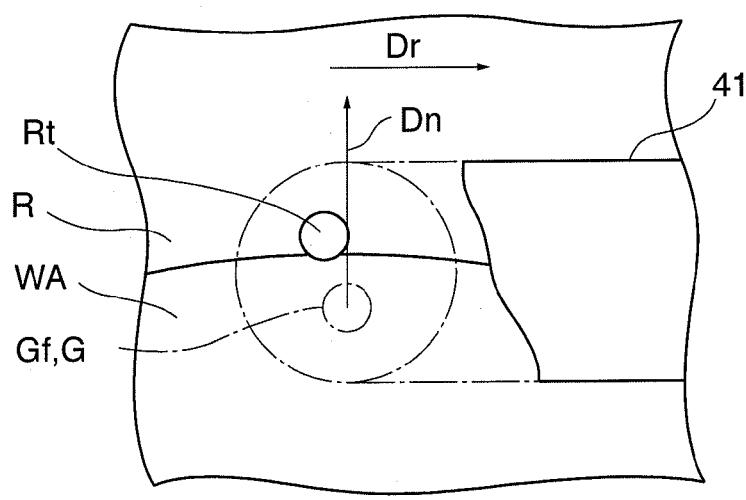
FIG. 3B is a partially enlarged plan view of a tip of a movable arm of the movement mechanism.

With reference to a partially enlarged plan view of FIG. 3B, a supply position of the rinse water R and the drying gas G to the topside surface WA of the substrate W will be explained. A collision position of the drying gas flow Gf with the topside surface WA is upstream of a rinse water collision range Rt (rinse agent collision range) in the nozzle moving direction Dn, which is a range in which the rinse water flow Rf collides with the topside surface WA of the substrate W. Moreover, considering the substrate rotation direction Dr which is the flowing direction of the rinse water R supplied to the topside surface WA in accordance with rotation of the substrate W seen from the outside of the substrate drying apparatus 1 (see FIG. 1A), a collision position of the rinse water flow Rf with the topside surface WA is the upstream side of the collision position of the drying gas flow Gf with the topside surface WA. At this time, collision positions of the rinse water flow Rf and the drying gas flow Gf to the topside surface WA are desired to be determined such that the drying gas flow Gf does not enter the rinse water collision range Rt within a range in which an effect of the drying gas G is substantially exerted on the rinse water R existing at least in the rinse water collision range Rt. Here, the range in which an effect of the drying gas G is substantially exerted on the rinse water R is a range in which one of effects of the drying gas G as reducing surface tension of the rinse water R can be exerted to an expected extent (an extent that the single wafer IPA drying is appropriately performed). The effect of reducing surface tension of the rinse water R is preferably exerted mainly by the drying gas G diffused after collision with the topside surface WA from a viewpoint of preventing scatter of the rinse water R spread by a centrifugal force accompanied with rotation of the substrate W. In addition, "a position" in which the rinse water flow Rf or the drying gas flow Gf collides with the topside surface WA is the center of gravity of a range of a fluid flow that collides with the topside surface WA. The rinse water nozzle 20 and the drying gas nozzle 30 are mounted to the movable arm 41 so that the rinse water flow Rf and the drying gas flow Gf can be supplied to the above mentioned positions of the substrate W.

Figure 4A:
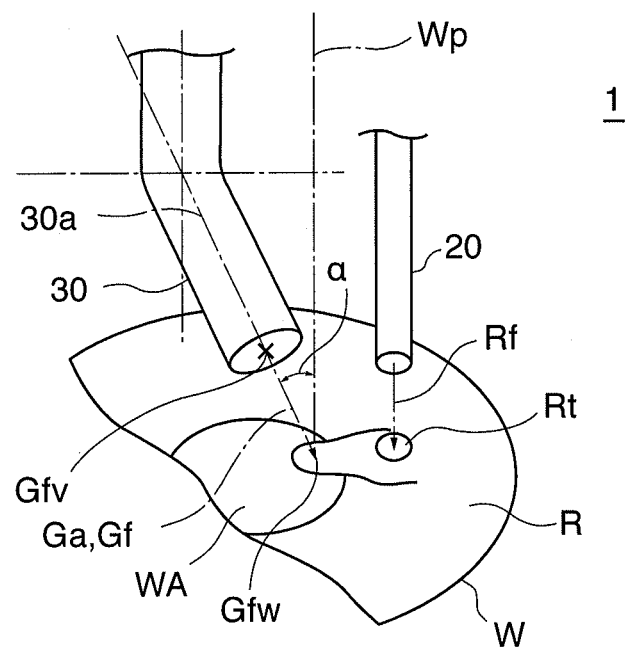
FIG. 4A is a partial perspective view illustrating a supply aspect of a drying gas flow in the substrate drying apparatus according to the first embodiment of the present invention.
Figure 4B:
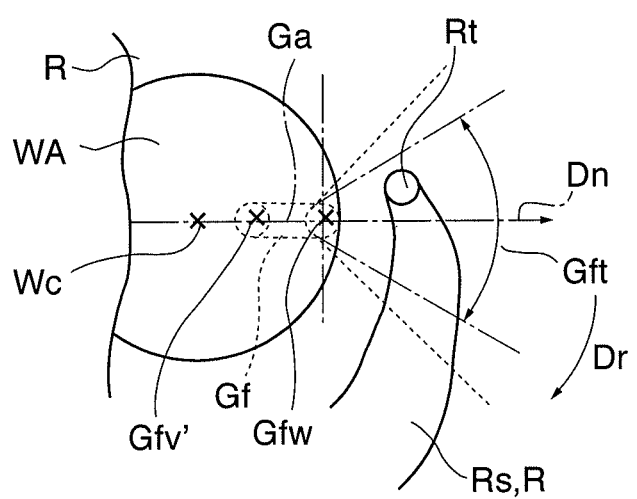
FIG. 4B is a plan view illustrating a supply aspect of the drying gas flow in the substrate drying apparatus according to the first embodiment of the present invention.

With reference to FIGS. 4A and 4B, an explanation is further made on the drying gas flow Gf. FIG. 4A is a partial perspective view illustrating the rinse water nozzle 20 and the drying gas nozzle 30 and their surroundings, and FIG. 4B is a plan view showing a state of the rinse water R and the drying gas G supplied on the substrate. FIG. 4B also shows a state when the drying gas flow Gf is projected on the topside surface WA from vertically above, that is, the topside surface WA is a projection plane. As shown in FIG. 4A, in a three-dimensional space, the drying gas flow Gf is supplied to the topside surface WA in a state that an angle formed by the drying gas flow axis Ga and the vertical line Wp of the substrate W is the inclined angle α. In addition, as shown in FIG. 4B, on the projection plane, in the drying gas flow Gf, a collision position Gfw with the substrate W is located downstream of a discharge position Gfv' from the drying gas nozzle 30 in the nozzle moving direction Dn. Here, the discharge position Gfv' is a position of a discharge position Gfv of the drying gas flow Gf from the drying gas nozzle 30, when the discharge position Gfv in a three-dimensional space is projected on the topside surface WA. In addition, on the projection plane, the drying gas flow axis Ga is in parallel with the nozzle moving direction Dn. In such a case, as the drying gas flow Gf is supplied to the topside surface WA, the drying gas G that collides with the topside surface WA is diffused like a Japanese folding fan centered at the collision position Gfw of the drying gas G in the nozzle moving direction Dn. In this embodiment, seen from a virtual line extending through the collision position Gfw in the nozzle moving direction Dn, an amount of the drying gas G diffusing upstream of the substrate rotation direction Dr is substantially same as that of the drying gas G diffusing downstream of the substrate rotation direction Dr. In FIG. 4B, a range Gft is a range that substantially exerts an effect of the drying gas G on the rinse water R.

With reference to mainly FIGS. 1A and 1B and referring to FIGS. 2 to 4B as needed, following the above, operation of the substrate drying apparatus 1 will be explained. The substrate W subjected to CMP and wet cleaning by chemical solution etc. in the previous step is held by the chuck claws 11 of the rotation mechanism 10. A wet cleaning process before a drying step may be executed on the rotation mechanism 10 on which a drying process is executed next. When the substrate W on which the drying process is executed next is held by the rotation mechanism 10, the movable arm 41 is moved until a discharge port of the rinse water nozzle 20 reaches a point facing a part adjacent to the rotation center Wc of the topside surface WA of the substrate W. At this time, the drying gas nozzle 30 is located such that the collision position Gfw of the drying gas flow Gf with the topside surface WA is upstream of the rotation center Wc of the topside surface WA in the nozzle moving position Dn.

When the movable arm 41 is moved to that point, the rotation driving shaft 12 is rotated in the substrate rotation direction Dr, thereby rotating the substrate W in the substrate rotation direction Dr in a horizontal plane. When the substrate W is rotated, the rinse water flow Rf is discharged from the rinse water nozzle 20 such that the rinse water R is supplied to the topside surface WA of the substrate W. At this time, a rotation speed of the substrate W is approximately 200 to 600 rpm, preferably approximately 300 to 500 rpm from a viewpoint that a centrifugal force is exerted on the rinse water R enough to cover the entire topside surface WA by the rinse water R supplied to the topside surface WA.

When the topside surface WA is covered by the rinse water R, the drying gas flow Gf is supplied from the drying gas nozzle 30 to the topside surface WA. Even when supply of the drying gas flow Gf to the topside surface WA is started, supply of the rinse water flow Rf to the topside surface WA is continued. Because the drying gas flow Gf is supplied to the topside surface WA, the rinse water R on a position on which the drying gas G is supplied is removed even on the part adjacent to the rotation center Wc with a small centrifugal force acting on the rinse water R on the topside surface WA, whereby a dry region appears on the topside surface WA. When supply of the drying gas flow Gf to the topside surface WA is started, the movable arm 41 is moved in the nozzle moving direction Dn, and accompanied with that, collision positions of the rinse water flow Rf and the drying gas flow Gf to the topside surface WA are moved in the nozzle moving direction Dn. In the drying gas nozzle 30 before the movable arm 41 starts operation, the collision position Gfw of the drying gas flow Gf with the topside surface WA is located upstream of the rotation center Wc of the topside surface WA in the nozzle moving direction Dn, so that the drying gas flow Gf that collides with the topside surface WA passes through the rotation center Wc as the movable arm 41 is moving. Until the collision position Gfw reaches the rotation center Wc after the movable arm 41 starts operation, a once-dried portion wets again because the rinse water R supplied to the topside surface WA is spread by rotation of the substrate W. However, no once-dried portion is made wet again after the collision position Gfw passes through the rotation center Wc. The movable arm 41 moves at a constant speed (angular speed) or while changing a speed (angular speed) until the collision position Gfw of the drying gas flow Gf with the topside surface WA reaches an outer peripheral end of the substrate W.

As the movable arm 41 is moved from the rotation center Wc to the outer periphery of the substrate W while the rinse water flow Rf and the drying gas flow Gf are supplied to the topside surface WA, in a plan view, a ring-shaped boundary between the rinse water R and the drying gas G (hereinafter, it is referred to as "ring-shaped gas-liquid boundary") is spread gradually and concentrically, and a dried region on the topside surface WA is gradually enlarged. The ring-shaped gas-liquid boundary is formed on a balanced position between an outermost part of a range in which the drying gas flow Gf collides with the topside surface WA and an innermost part of a range of the rinse water collision range Rt based on the various conditions such as a flow rate of each of the rinse water flow Rf and the drying gas flow Gf supplied to the topside surface WA and the inclined angle α of the drying gas flow Gf. At this time, in the ring-shaped gas-liquid boundary, because the drying gas G is sprayed to the rinse water R, IPA of the drying gas G is dissolved into the rinse water R, which reduces surface tension of the rinse water R. A concentration of IPA dissolved in the rinse water R becomes lower as the rinse water R is away from a contact position to the drying gas flow Gf, so that the surface tension of the rinse water R includes a gradient which is lower on the upstream side and becomes gradually higher on the downstream side in the nozzle moving direction Dn. Due to this gradient of surface tension, a Marangoni force in which the rinse water R is drawn from the side with small surface tension to the side with large surface tension is acted. In addition to this, by rotation of the substrate W, a centrifugal force in which the rinse water R is drawn from the side of the rotation center Wc to the side of an outer periphery of the substrate W is exerted. Further, the drying gas G tries to draw out the rinse water R (make a film of the rinse water R covering the topside surface WA thin). By organic linkage among the Marangoni force, the centrifugal force and a force by the drying gas G to draw out the rinse water R, the rinse water R is effectively removed from the topside surface WA. According to the single wafer IPA drying described above, a drying process can be effectively executed also to the hydrophobic topside surface WA. Additionally, it is understood that the single wafer IPA drying described above can be applied also to a hydrophilic surface.

Generally speaking, when a substrate surface is hydrophobic, liquid on the substrate surface has a large contact angle by surface tension, so that a liquid film covering the substrate surface becomes thicker compared with the case of a hydrophilic surface. On the other hand, as centrifugal force acting on the liquid film varies depending on the distance from the rotation center of the substrate, the thickness of the liquid film also varies. Conventionally, an attempt to perform single wafer IPA drying effectively has been executed by adjusting IPA concentration or the temperature of drying gas in accordance with the thickness of the liquid film. However, adjustment of IPA concentration or the temperature of drying gas makes the apparatus configuration and control of the apparatus complicated.

The substrate drying apparatus 1 according to the embodiment achieves organic operation between the Marangoni force, the centrifugal force and reduction of the film thickness of the rinse water R by applying a technical concept of "appropriately" inclining the drying gas flow Gf supplied to the topside surface WA through a trial and error process to further reduce the film thickness of the rinse water R covering the topside surface WA in the single wafer IPA drying in a more convenient manner, which leads to reduction of a drying load or improvement of drying property. As a result, effectiveness of the single wafer IPA drying is improved in a more convenient manner. In a conventional apparatus in which a drying gas flow is supplied vertically to a substrate surface, the drying gas flow is equally diffused radially after it collides with a substrate and more than half of the drying gas flows to an already dried portion, which reduces an effect of reducing surface tension of a liquid film to that extent. On the other hand, in the substrate drying apparatus 1, since the axis Ga of the drying gas flow Gf supplied to the topside surface WA is inclined with the inclined angle α to the vertical line Wp, flowing of the drying gas G to the dried region is inhibited, so that IPA can be effectively supplied to the rinse water R and reduction of the film thickness of the rinse water R is accelerated. Moreover, since the inclined angle α is greater than or equal to a half of the contact angle θ (a half contact angle θ/2) of a droplet of the rinse water R on the topside surface WA, an effect in which the drying gas G draws out the rinse water R to the side of the outer periphery of the substrate W is efficiently provided (when the inclined angle α is too small, a force by the drying gas to press the liquid to the side of the outer periphery becomes small). In addition, the inclined angle α is smaller than or equal to an angle in which the half contact angle θ/2 is deducted from 90° (90°−θ/2), which prevents spattering of the rinse water R (especially, a surface of a film of the rinse water R) to attach to the already dried portion of the topside surface WA. That is, the reason why a maximum value of the inclined angle α is determined while a force by the drying gas to press the liquid to the outer periphery increases as the inclined angle α becomes larger is that, if the inclined angle α is too large when the contact angle θ is large, the drying gas flow Gf disturbs the film of the rinse water R to blow off an upper part of the film of the rinse water R to form a droplet, and if this droplet attaches to the dried topside surface WA, there is a risk of occurrence of defects (a watermark and the like). Regarding this point, the film of the rinse water R on the topside surface WA tends to be spattered as the film of the rinse water R becomes thicker. However, an appropriate inclined angle α can be set by determining the inclined angle α based on the contact angle θ related to the film thickness of the rinse water R. This suggests that the smaller the contact angle θ becomes, the wider an acceptable range of the inclined angle α becomes.

When the movable arm 41 reaches the outer periphery of the substrate W, supply of the rinse water flow Rf and the drying gas flow Gf to the topside surface WA is stopped. At this time, the supply of the rinse water flow Rf to the topside surface WA may be firstly stopped, and thereafter the supply of the drying gas flow Gf may be stopped. Following that, a rotation speed of the substrate W is raised (in this embodiment, it is raised to approximately 800 to 2000 rpm) to eliminate droplets remaining at an outer end portion (edge portion) and a rear surface of the substrate W by centrifugal force. The drying step is finished with this process, and after the rotation of the substrate W is stopped, the substrate W is delivered from the rotation mechanism 10.

Figure 5A:
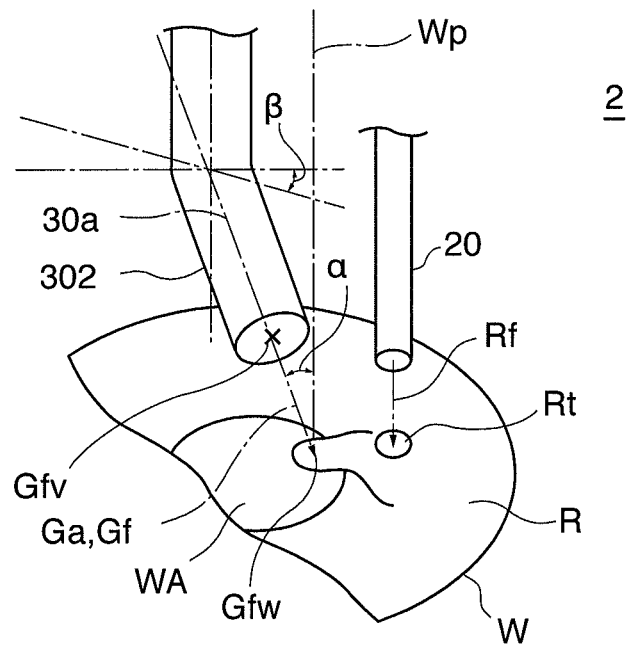
FIG. 5A is a partial perspective view illustrating a supply aspect of the drying gas flow in the substrate drying apparatus according to the second embodiment of the present invention.
Figure 5B:
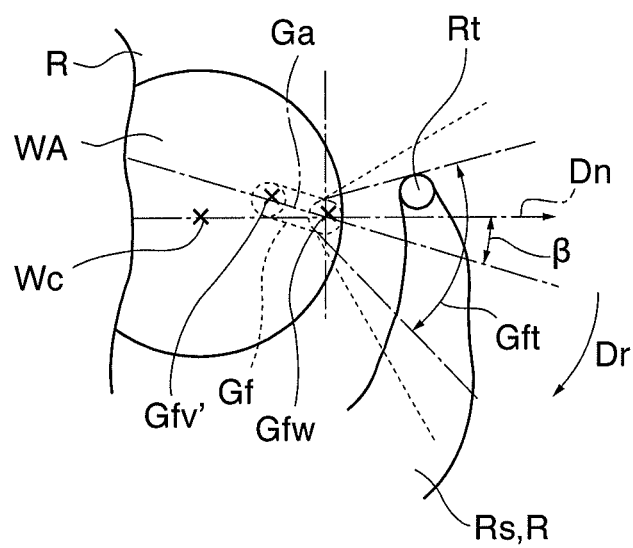
FIG. 5B is a plan view illustrating a supply aspect of the drying gas flow in the substrate drying apparatus according to the second embodiment of the present invention.

Next, with reference to FIGS. 5A and 5B, a substrate drying apparatus 2 according to the second embodiment will be explained. FIG. 5A is a partial perspective view illustrating a rinse water nozzle 20 and a drying gas nozzle 302 and their surroundings of the substrate drying apparatus 2, and FIG. 5B is a plan view showing a state of rinse water R and drying gas G supplied on a substrate. FIG. 5B also shows a state that the topside surface WA is a projection plane. This substrate drying apparatus 2 is different from the substrate drying apparatus 1 (see FIG. 1A) in the following point. That is, the substrate drying apparatus 2 includes the drying gas nozzle 302 that discharges the drying gas flow Gf in the different direction from the drying gas nozzle 30 of the substrate drying apparatus 1 (see FIGS. 1A and 1B). More specifically, on the projection plane (in FIG. 5B), the collision position Gfw of the drying gas flow Gf with the substrate W is positioned downstream of the discharge position Gfv' of the drying gas flow Gf from the drying gas nozzle 302 in each of the both components of the nozzle moving direction Dn and the substrate rotation direction Dr. In addition, on the projection plane, a turning angle β is formed by the drying gas flow axis Ga and the nozzle moving direction Dn. The turning angle β (degree of turning) is preferably as large as possible within a range that an effect of the drying gas G is substantially exerted on the rinse water R in a rinse water collision range Rt. In FIG. 5B, a range Gft is one in which the drying gas G can substantially exert its effect to the rinse water R. The turning angle β is preferably more than 0° and equal to or less than 60°, and on the projection plane, and in an angle formed by a virtual line passing through the position Gfv' as well as the position Gfw and a tangent line of the ring-shaped gas-liquid boundary in a range that the drying gas flow Gf collides with the topside surface WA, an angle formed by the inside of the substrate W and the downstream side of the substrate rotation direction Dr is preferably in a range of more than 90° and equal to or less than 150° or less. Additionally, when the turning angle β is 0°, the direction is the same as that of the drying gas flow axis Ga in the substrate drying apparatus 1 (see FIGS. 1A and 4A) described above. The configurations of the substrate drying apparatus 2 other than those described above are the same as those of the substrate drying apparatus 1 (see FIG. 1A) including the point that the drying gas flow Gf is supplied to the topside surface WA in a state that the inclined angle α is formed by the drying gas flow axis Ga and the vertical line Wp of the substrate W in a three-dimensional space.

In the substrate drying apparatus 2 thus configured, when the single wafer IPA drying is executed, to rinse water Rs which is supplied to the topside surface WA and extending in the substrate rotation direction Dr accompanied with the rotation of the substrate W, an effect of the drying gas G (reducing surface tension of the rinse water R by IPA etc.) can be exerted on a wider range compared with the case of the substrate drying apparatus 1 (see FIG. 1A). That is, the rinse water flow Rf supplied to the topside surface WA firstly contacts to the topside surface WA in a rinse water collision range Rt, and is spread like the rinse water Rs accompanied with the rotation of the substrate W. In FIG. 5B, a state that the substrate W is rotated by 90° is shown; however, when the substrate W is rotated by 360°, the rinse water R that firstly collides with the topside surface WA returns to a portion adjacent to the rinse water collision range Rt in a spread state. At this time, the returned rinse water R approaches the outer periphery of the substrate W compared with an initial state by a centrifugal force or a Marangoni force. In dissolving IPA in the rinse water R, supplying the drying gas G to the rinse water R immediately after supply contributes more to reduction of the film thickness of the rinse water R than supplying the drying gas G to the returned rinse water R. Thus, according to the substrate drying apparatus 2, reduction of the film thickness of the rinse water R is accelerated rather than the case of the substrate drying apparatus 1 (see FIG. 1A).

Figure 6A:
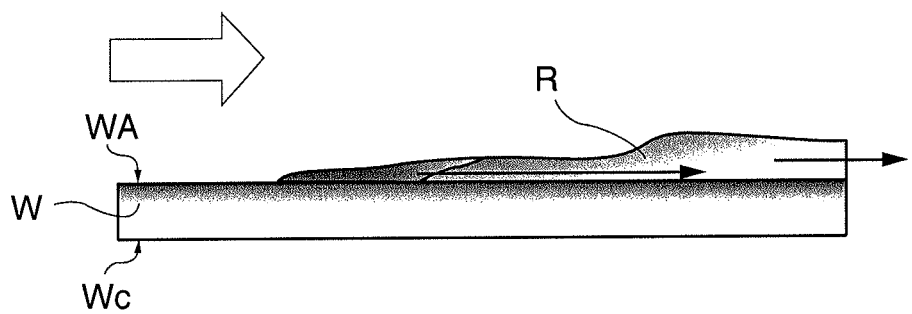
FIG. 6A is a drawing illustrating a state of a film thickness of the rinse water when single wafer IPA drying is executed by the substrate drying apparatus according to the second embodiment of the present invention.
Figure 6B:
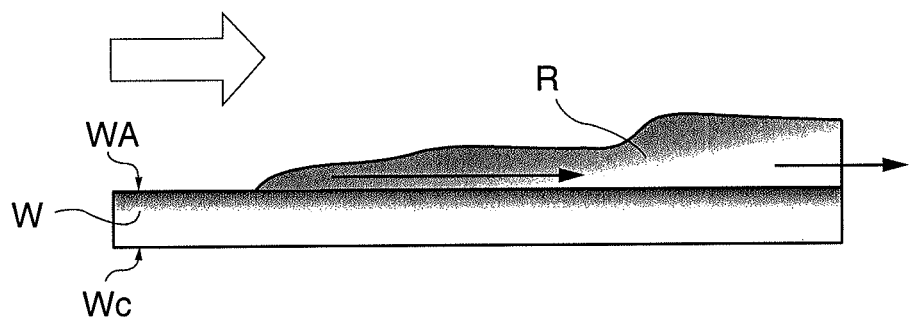
FIG. 6B is a drawing illustrating a state of a film thickness of the rinse water when single wafer IPA drying is executed by the substrate drying apparatus according to the first embodiment of the present invention.
Figure 6C:
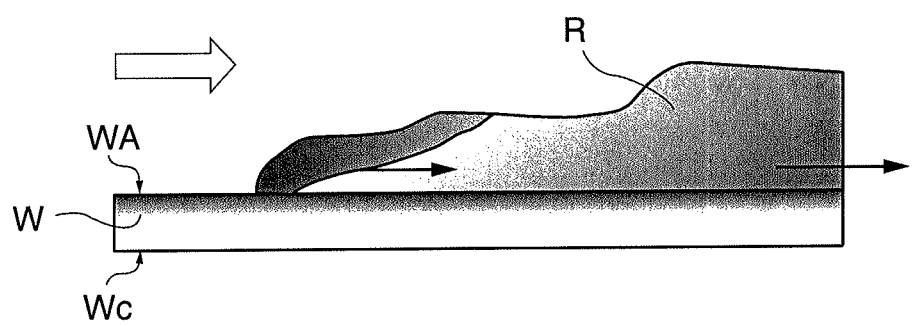
FIG. 6C is a drawing illustrating a state of a film thickness of the rinse water when single wafer IPA drying is executed by an apparatus in which a drying gas flow is supplied vertically to a surface of the substrate as a comparative example.

FIGS. 6A to 6C respectively show a state of film thickness of the rinse water R when the single wafer IPA drying is executed for each apparatus. FIG. 6A is a state of the substrate drying apparatus 2 (see FIG. 5A), FIG. 6B is a state of the substrate drying apparatus 1 (see FIG. 1), and FIG. 6C is a state that the drying gas flow is supplied vertically to the topside surface WA of the substrate W as a comparative example. As shown in FIG. 6A, the substrate drying apparatus 2 (see FIG. 5A) preferably executes reduction of the film thickness of the rinse water R. This seems to be because the rinse water R supplied to the topside surface WA is thinned by centrifugal force and the drying gas G is applied to the thinned rinse water R, and consequently reduction of the film thickness is further accelerated. FIG. 6B shows the case of the substrate drying apparatus 1 (see FIG. 1A), which includes less drying gas G that acts on the downstream side of the substrate rotation direction Dr from the rinse water collision range Rt compared with the case of the substrate drying apparatus 2 (see FIG. 5A), and that as a result a film of the rinse water R is thicker than the substrate drying apparatus 2 (see FIG. 5A), but thinner than the case of a vertical drying gas flow (see FIG. 6C). In a comparative example shown in FIG. 6C, only approximately a half of the supplied drying gas G acts on the rinse water R, so that a film of the rinse water R is thicker than that of each of the substrate drying apparatus 1 (see FIG. 1A) and the substrate drying apparatus 2 (FIG. 5A). Additionally, in the substrate drying apparatus 2 (see FIG. 5A), even if the inclined angle α is deviated from a range of $\theta/2 \le \alpha \le 90° - \theta/2$ to some extent (typically approximately θ/4), the drying gas flow can improve efficiency of the single wafer IPA drying in a more convenient manner than in a case that the drying gas flow is vertically supplied to the topside surface WA of the substrate W. However, in such a case, the film thickness of the rinse water R when the single wafer IPA drying is executed is approximately the same as that of the substrate drying apparatus 1 (see FIG. 1A) shown in FIG. 6B.

Figure 7A:
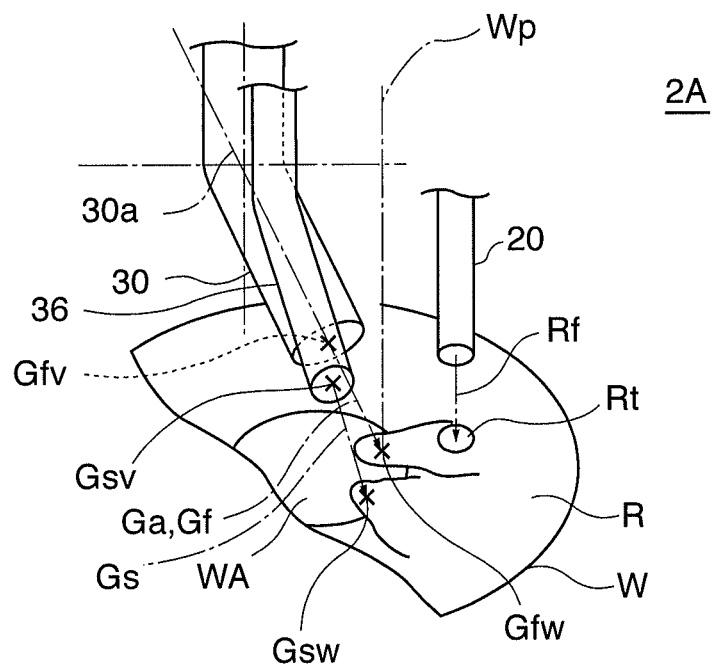
FIG. 7A is a partial perspective view illustrating a supply aspect of the drying gas flow in the substrate drying apparatus according to a variation of the second embodiment of the present invention.
Figure 7B:
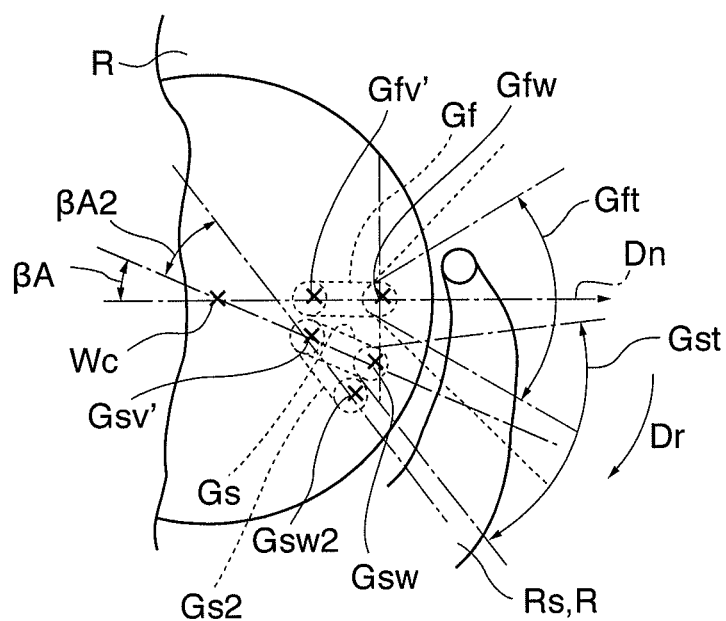
FIG. 7B is a plan view illustrating a supply aspect of the drying gas flow in the substrate drying apparatus according to the variation of the second embodiment of the present invention.

Next, with reference to FIGS. 7A and 7B, the substrate drying apparatus 2A according to a variation of the second embodiment will be explained. FIG. 7A is a partial perspective view illustrating each nozzle and its surroundings of the substrate drying apparatus 2A, and FIG. 7B is a plan view showing a state of the rinse water R and the drying gas G supplied on the substrate. FIG. 7B also shows a state that the topside surface WA is a projection plane. In the substrate drying apparatus 2A, to the substrate drying apparatus 1 (see FIG. 1A), an additional drying gas nozzle 36 is provided separately from the drying gas nozzle 30. The additional drying gas nozzle 36 is mounted to the movable arm 41 (see FIG. 1A). The additional drying gas nozzle 36 is provided downstream of the rinse water collision range Rt in the substrate rotation direction Dr on a projection plane from a viewpoint that wetting of a region of the dried substrate W by the rinse water R should be avoided. Fluid supplied from the additional drying gas nozzle 36 to the substrate W is typically the same as the drying gas flow Gf discharged from the drying gas nozzle 30; however, for convenience of explanation, a drying gas flow discharged from the additional drying gas nozzle 36 is represented as "Gs" to tell it from the other.

On a projection plane (in FIG. 7B), the drying gas flow Gs discharged from the additional drying gas flow nozzle 36 includes a nozzle moving direction component in the nozzle moving direction Dn and a substrate rotation direction component in the substrate rotation direction Dr, and the collision position Gsw with the substrate W is positioned downstream of the discharge position Gsv' from the additional drying gas nozzle 36 in these components. Additionally, the discharge position Gsv' is a position of a discharge position Gsv of the drying gas flow Gs from the additional drying gas nozzle 36, when the discharge position Gsv in a three-dimensional space is projected on the topside surface WA. In addition, on the projection plane, the turning angle βA is formed by the axis of the drying gas flow Gs and the nozzle moving direction Dn. The turning angle βA (degree of turning) is desired to be determined within a range of overlap between a range Gft that substantially exerts on the rinse water R an effect of the drying gas G, which the drying gas flow Gf discharged from the drying gas nozzle 30 is diffused after collision with the topside surface WA, and a range Gst that substantially exerts on the rinse water R an effect of drying gas G, which the drying gas flow Gs discharged from the additional drying gas nozzle 36 is diffused after collision with the topside surface WA. The overlap between the range Gft and the range Gst is preferably as small as possible from a viewpoint that an effect of the drying gas G can be substantially exerted on as wide range of rinse water R as possible. Moreover, the range Gst is spread downstream of the range Gft in the substrate rotation direction Dr, and on the projection plane, in the drying gas flow Gs, in an angle formed by a virtual line passing through the position Gsv' as well as the position Gsw and a tangent of a ring-shaped gas-liquid boundary in a range in which the drying gas flow Gs collides with the topside surface WA, an angle formed by the inside of the substrate W and the downstream side of the substrate rotation direction Dr is preferably more than 90°. Further, in a three-dimensional space, the axis of the drying gas flow Gs is inclined to the vertical line Wp of the substrate W. An angle formed by the axis of the drying gas flow Gs and the vertical line Wp of the substrate W may be the same as or different from the inclined angle α regarding the drying gas flow Gf discharged from the drying gas nozzle 30.

In the substrate drying apparatus 2A thus configured, when the single wafer IPA drying is executed, an effect of the drying gas G (reducing the surface tension of the rinse water R by IPA etc.) can be exerted on the rinse water Rs which is supplied to the topside surface WA and extending in the substrate rotation direction Dr accompanied with rotation of the substrate W in a combined range of the range Gft and the range Gst, so that an effect of the drying gas G can be exerted on a wider range compared with the case of the substrate drying apparatus 1 (see FIG. 1A). Thus, the substrate drying apparatus 2A executes reduction of the film thickness of the rinse water R more than the case of the substrate drying apparatus 1 (see FIG. 1A).

In FIG. 7B, additionally, in the direction shown as a symbol "Gs2", the drying gas flow Gs2 may be supplied instead of the drying gas flow Gs. That is, the drying gas flow Gs may be supplied to the substrate W as the drying gas flow Gs2 having a position Gsw2 in which the collision position with the substrate W is further moved on the downstream side of the substrate rotation direction Dr (further rotated by the turning angle βA2) centered at the position Gsv discharged from the additional drying gas nozzle 36. The turning angle βA2 is desirably determined in a range of overlap between a range (not shown) in which the drying gas G can substantially exert its effect to the rinse water R in which the drying gas flow Gs2 is diffused after collision with the topside surface WA and the range Gft regarding the drying gas flow Gf. More specifically, on a projection plane, in an angle formed by a virtual line passing through the position Gsv' as well as the position Gsw2 and a tangent of a ring-shaped gas-liquid boundary in a range in which the drying gas flow Gs2 collides with the topside surface WA, an angle formed by the inside of the substrate W and the downstream side of the substrate rotation direction Dr is preferably in a range of more than 90° and 150° or less. This inhibits increase of collision energy on a boundary surface between the drying gas flow Gs2 and the film of the rinse water R and excessive disturbance of a liquid film state of the region. The additional drying gas nozzle 36 explained above can be also applied to the substrate drying apparatus 2 (see FIG. 5A).

The above description explains that, according to the substrate drying apparatuses 1, 2 and 2A, IPA dissolved in the rinse water R can be easily increased without adjusting IPA concentration or the temperature of drying gas. However, this does not prevent superposed application of adjustment of IPA concentration or the temperature of drying gas to the substrate drying apparatuses 1, 2 and 2A. By superposed application of adjustment of IPA concentration or the temperature of the drying gas to the substrate drying apparatuses 1, 2 and 2A, the single wafer IPA drying can be executed more efficiently.

In the above description, the movement mechanism 40 functions as both the rinse agent nozzle movement mechanism and the drying gas nozzle movement mechanism. However, the rinse water nozzle movement mechanism and the drying gas nozzle movement mechanism may be formed separately.

In the above description, the rotation mechanism 10 holds the substrate W with the chuck claws 11. However, the substrate W may be held with a roller chuck.

In the above description, the rinse water flow Rf is vertically supplied to the topside surface WA of the substrate W. However, the rinse water flow Rf may be inclined to the vertical line of the topside surface WA. Even in this case, a positional relationship in which the rinse water flow Rf and the drying gas flow Gf collide with the topside surface WA is as described above.

Figure 8A:
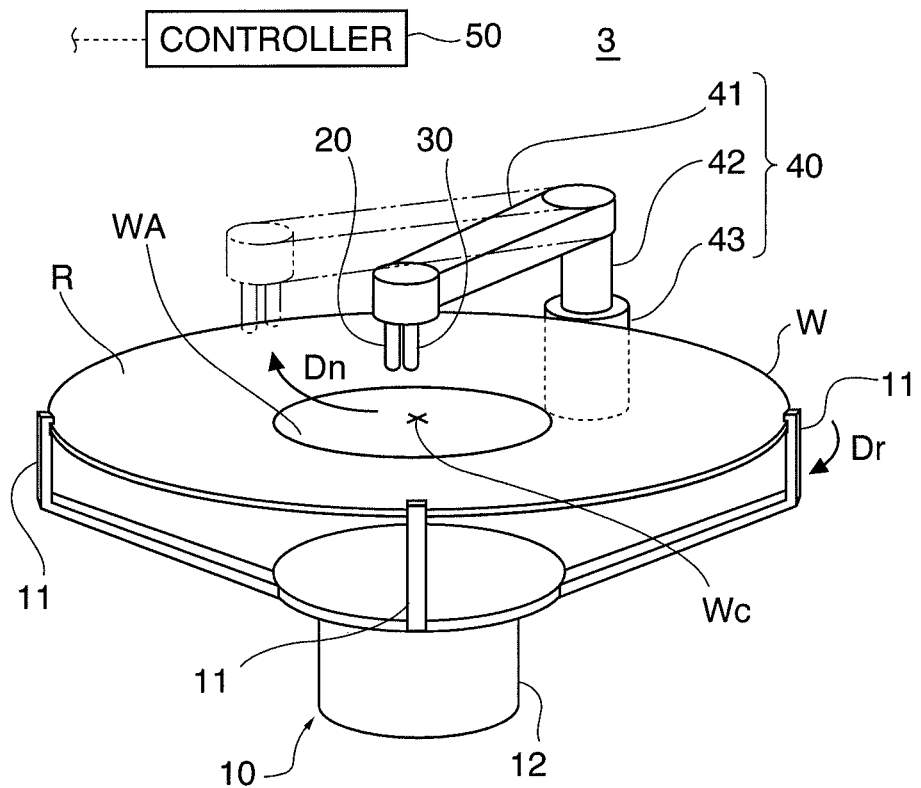
FIG. 8A is a perspective view showing a schematic configuration of the substrate drying apparatus according to the third embodiment of the present invention.
Figure 8B:
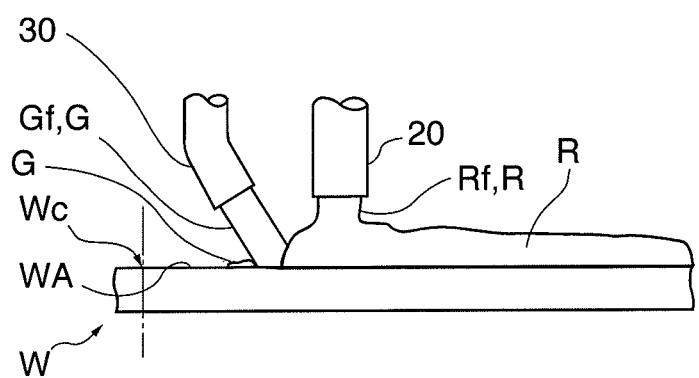
FIG. 8B is a partially enlarged side view of the tip of the nozzle and its surroundings.

Next, with reference to FIGS. 8A and 8B, a substrate drying apparatus 3 according to the third embodiment will be explained. FIG. 8A is a perspective view showing the schematic configuration of the substrate drying apparatus 3, and FIG. 8B is a partially enlarged side view of a tip of a nozzle and its surroundings. The substrate drying apparatus 3 comprises a rotation mechanism 10, a rinse water nozzle 20, a drying gas nozzle 30, a movement mechanism 40 and a controller 50 that controls operation of the substrate drying apparatus 3 including operation of the rotation mechanism 10 and the movement mechanism 40. The rinse water nozzle 20 is an apparatus that supplies rinse water R as rinse agent to the substrate W. Also in this embodiment, the movement mechanism functions as both a rinse agent nozzle movement mechanism and a drying gas nozzle movement mechanism.

The rotation mechanism 10 rotates the substrate W in the substrate rotation direction Dr in a horizontal plane by rotation of a rotation driving shaft 12 around the axis. A rinse water flow Rf supplied from the rinse water nozzle 20 is narrow compared to an area of the topside surface WA of the substrate W. The diameter of the rinse water flow Rf (a cross-sectional diameter of the rinse water flow Rf) discharged from the rinse water nozzle 20 to collide with the topside surface WA of the substrate W is substantially the same as an inner diameter of the rinse water nozzle 20. The drying gas nozzle 30 supplies the drying gas G to the substrate W that supplies IPA to a film of the rinse water R covering the topside surface WA of the substrate W and pushes away the film of the rinse water R. The drying gas nozzle 30 supplies the drying gas G in a state of a gas flow (drying gas flow Gf). The drying gas flow Gf is narrow compared to an area of the topside surface WA of the substrate W. The diameter of the drying gas flow Gf (cross-sectional diameter of the drying gas flow Gf) discharged from the drying gas nozzle 30 to collide with the topside surface WA of the substrate W is substantially the same as an inner diameter of the drying gas nozzle 30. The drying gas flow Gf is set to the size appropriate for the single wafer IPA drying. Moreover, the relationship between the collision position of the rinse water flow Rf and the collision position of the drying gas flow Gf with the topside surface WA of the substrate W is determined from a viewpoint that the single wafer IPA drying is appropriately executed. Here, the collision position of the rinse water flow Rf or the drying gas flow Gf with the topside surface WA is the center of gravity of a range in which a fluid flow collides with the topside surface WA. Typically, even when the rinse water flow Rf and the drying gas flow Gf move, a state that the drying gas flow Gf is closer to the center than the rinse water flow Rf is maintained.

In this embodiment, a drying gas G generating apparatus is configured as follows. For example, IPA liquid is retained in a sealed state in a cylindrical container (not shown) constituted of metal such as stainless steel. An inflow tube (not shown) that introduces inactive gas into the container and a discharge tube (not shown) that discharges the inactive gas including IPA vapor from the container to the drying gas nozzle 30 penetrate through an upper end surface of the cylindrical container. An end of the inflow tube in the container is soaked in IPA liquid. On the other hand, an end of the discharge tube in the container is positioned in a gas-filled portion above the IPA liquid and not soaked in the IPA liquid. Moreover, a contact type fluid level sensor for maintaining a liquid level of the IPA liquid in the container to a predetermined range is provided in the container. The fluid level sensor detects a high level and a low level of the IPA liquid in the container, and when it detects a low level, it actuates a pump (not shown) to supply the IPA liquid to the container, and when it detects a high level, it stops the pump to stop the supply of the IPA liquid to the container. To have IPA vapor contained in the drying gas flow Gf discharged from the drying gas nozzle 30, bubbling is executed by blowing inactive gas from the inflow tube into the IPA liquid. Then, the IPA vapor is saturated in the inactive gas and accumulated in a portion above the IPA liquid of the container, and this IPA vapor is introduced from the container by the discharge tube to be guided to the drying gas nozzle 30. Typically, in order to adjust an amount of the IPA vapor in the inactive gas discharged from the drying gas nozzle 30, inactive gas in which IPA vapor is saturated and which is guided to the drying gas nozzle 30 is diluted by adding inactive gas from an additional line.

Figure 9:
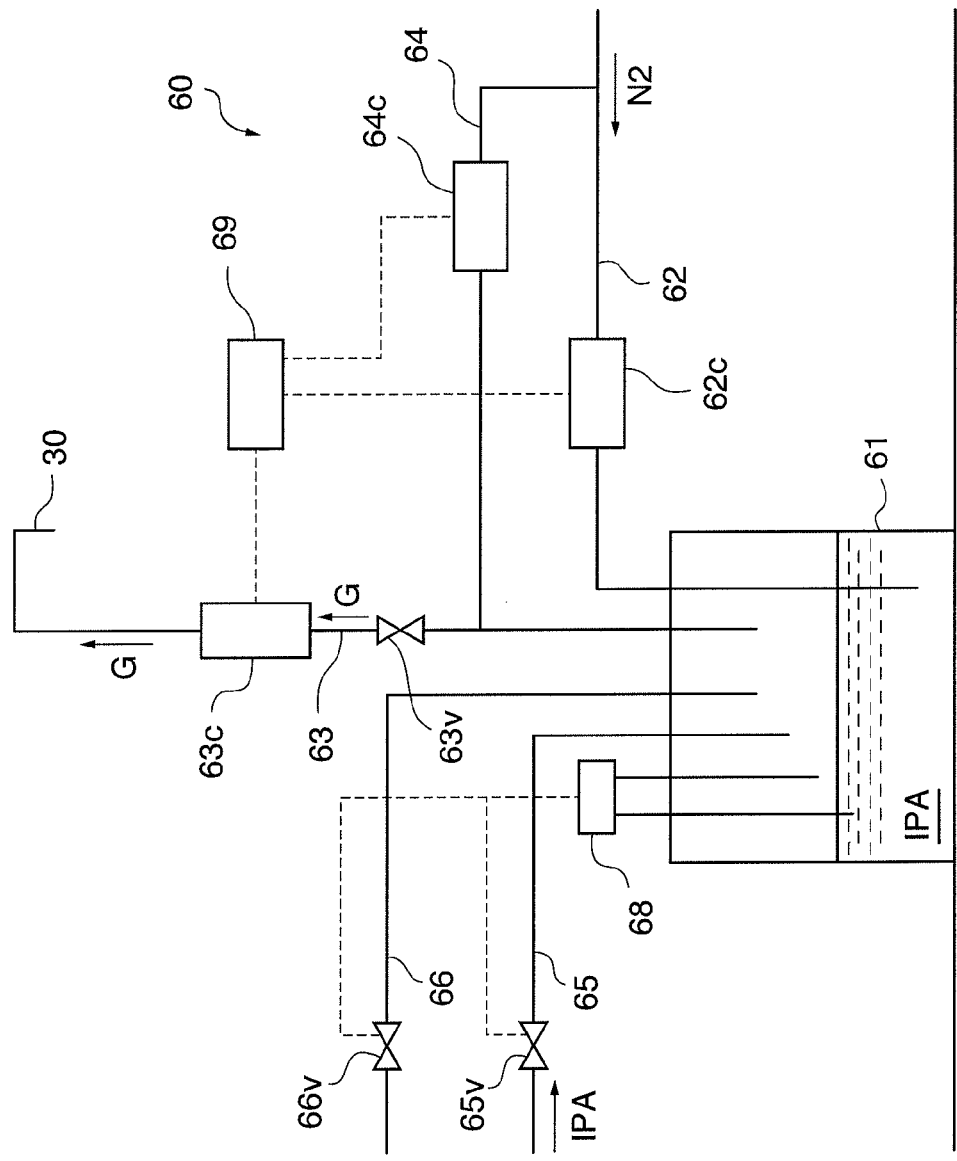
FIG. 9 is a schematic system diagram of a drying gas generating apparatus and its surroundings.

Here, with reference to FIG. 9, an embodiment of the drying gas G generating apparatus will be explained. FIG. 9 is a schematic systematic diagram of a drying gas generating apparatus 60 and its surroundings. The drying gas generating apparatus 60 includes an airtight container 61 in which IPA liquid is retained, and an inflow tube 62 that introduces nitrogen gas N2 into the container 61 and a discharge tube 63 that discharges the nitrogen gas N2 containing IPA vapor from the container 61 penetrate through an upper end surface of the container 61. In the container 61, an end of the inflow tube is soaked in the IPA liquid, and an end of the discharge tube 63 is not soaked in the IPA liquid. A mass flow controller 62c (hereinafter, referred to as "MFC") is inserted and disposed in the inflow tube 62, and an MFC 63c is inserted and disposed in the discharge tube 63. The MFC 62c and 63c are devices that adjust a flow rate of fluid, having an excellent responsiveness and stability to immediately perform control to a predetermined flow rate value. A valve 63v is inserted and disposed in the discharge tube 63 upstream of the MFC 63c. The inflow tube 62 upstream of the MFC 62c communicates with the discharge tube 63 upstream of the valve 63v via a bypass tube 64. An MFC 64c is inserted and disposed in the bypass tube 64. The MFC 62c, 63c and 64c are respectively connected to an IPA concentration detecting portion 69 by a signal cable to adjust a flow rate of fluid passing through each of the inflow tube 62, the discharge tube 63 and the bypass tube 64 such that a flow rate and IPA concentration of the drying gas G to be supplied to the drying gas nozzle 30 are desired values.

In the container 61, a fluid level sensor 68 for maintaining a liquid level of the IPA liquid in the container to a predetermined range is provided. Moreover, an IPA supply tube 65 that introduces the IPA liquid in the container 61 and a gas venting tube 66 that extracts gas in an upper portion of the container 61 penetrate through an upper end surface of the container 61. In the container 61, each of the IPA supply tube 65 and the gas venting tube 66 has an end positioned above the IPA liquid surface. An IPA supply valve 65v is inserted and disposed in the IPA supply tube 65, and a gas venting valve 66v is inserted and disposed in the gas venting tube 66. The IPA supply valve 65v and the gas venting valve 66v are respectively connected to the fluid level sensor by a signal cable, and when the fluid level sensor 68 detects a low liquid level, the IPA supply valve 65 is opened and the IPA liquid is supplied to the container 61, and on the other hand, when the fluid level sensor 68 detects a high liquid level, the IPA supply valve 65v is closed to stop the supply of the IPA liquid to the container 61. The gas venting valve 66v is also opened and closed in conjunction with opening and closing of the IPA supply valve 65v, thereby supplying the IPA liquid to the container 61 smoothly.

In the drying gas generation apparatus 60 thus configured, when the drying gas G is generated, nitrogen gas N2 is introduced into the inflow tube 62 and/or the bypass tube 64 in a state that the IPA supply valve 65v and the gas venting valve 66v are closed. The nitrogen gas N2 introduced in the container 61 via the inflow tube 62 is blown into the IPA liquid in the container 61, and the IPA liquid is gasified by bubbling, so that mixed gas of the IPA vapor and the nitrogen gas N2 is generated above the IPA liquid. The mixed gas flows in the discharge tube 63 toward the drying gas nozzle 30, and in the middle of the flow, nitrogen gas N2 is added from the bypass tube 64 in accordance with need. As a result, the drying gas G in which IPA concentration is adjusted is generated and supplied to the drying gas nozzle 30. In this way, IPA concentration in the drying gas G is adjusted to a desired concentration with excellent responsiveness. Returning to FIGS. 8A and 8B again, the configuration of the substrate drying apparatus 3 will be further explained.

The controller 50 is connected to the rotation driving shaft 12 of the rotation mechanism 10 via a signal cable, and by adjusting a rotation speed of the rotation driving shaft 12, a rotation speed of the substrate W is adjusted. In addition, the controller 50 adjusts a flow rate of the rinse water flow Rf discharged from the rinse water nozzle 20. Further, the controller 50 adjusts not only a flow rate of the drying gas flow Gf discharged from the drying gas nozzle 30 but also IPA concentration contained in the drying gas G. Moreover, the controller 50 is connected to the driving source 43 of the movement mechanism 40 via a signal cable, and a moving speed of the movable arm 41 is adjusted by rotation speed adjustment of the movable shaft 42 driven by the driving source 43.

With reference to FIGS. 8A and 8B continuously, operation of the substrate drying apparatus 3 will be explained. Although the operation of the substrate drying apparatus 3 is one aspect of a substrate drying method according to the third embodiment, the substrate drying method according to the third embodiment may be configured to be executed in apparatuses other than the substrate drying apparatus 3. An operation of each member in the following explanation is controlled by the controller 50. The substrate W subjected to CMP and wet cleaning by chemical solution etc. in the previous step is held by the chuck claws 11 of the rotation mechanism 10. A wet cleaning process before a drying step may be executed on the rotation mechanism 10 on which a drying process is executed next. When the substrate W on which the drying process is executed next is held by the rotation mechanism 10, the movable arm 41 is moved until a discharge port of the rinse water nozzle 20 reaches a point facing a part adjacent to the rotation center Wc of the topside surface WA of the substrate W. At this time, the drying gas nozzle 30 is located at a position where the rotation center Wc of the topside surface WA is in a collision range of the drying gas flow Gf with the topside surface WA and the center of gravity of the collision range is upstream of the rotation center Wc of the topside surface WA in the nozzle moving direction Dn. Additionally, the "collision range" is a range in which the drying gas flow Gf collides with the topside surface WA (an outer periphery of the cross section when the axial rectangular cross section of the drying gas flow Gf is projected on the topside surface WA in the axial direction) when it is assumed that no rinse water R exists on the topside surface WA. Moreover, the nozzle moving direction Dn is the direction in which the drying gas G moves from the rotation center Wc to the outer periphery of the substrate W when the topside surface WA is dried.

When the movable arm 41 is moved to the above position, the rinse water flow Rf is discharged from the rinse water nozzle 20 such that the rinse water R is supplied to the topside surface WA of the substrate W. When the supply of the rinse water flow Rf to the topside surface WA is started, the rotation driving shaft 12 is rotated, whereby the substrate W is rotated in a horizontal plane. At this time, a rotation speed of the substrate W is gradually increased, and acceleration is preferably 300 rpm or less per one second from a viewpoint that even when the topside surface WA is hydrophobic, the topside surface WA is covered by a film of the rinse water R preventing scatter of the rinse water R. On the other hand, from a viewpoint of improving throughput, the acceleration is desired to be as large as possible in a range that the topside surface WA is covered by the film of the rinse water R.

When the topside surface WA is covered by the rinse water R and a rotation speed of the substrate W is increased to a predetermined value, the drying gas flow Gf is supplied to the topside surface WA from the drying gas nozzle 30. Even when supply of the drying gas flow Gf to the topside surface WA is started, supply of the rinse water flow Rf to the topside surface WA is continued. Because the drying gas flow Gf is supplied to the topside surface WA, the rinse water R on a position on which the drying gas G is supplied is removed even on the part adjacent to the rotation center Wc with a small centrifugal force acting on the rinse water R on the topside surface WA, whereby a dry region appears on the topside surface WA. When supply of the drying gas flow Gf to the topside surface WA is started, the movable arm 41 is moved in the nozzle moving direction Dn, and accompanied with that, collision positions of the rinse water flow Rf and the drying gas flow Gf to the topside surface WA are moved in the nozzle moving direction Dn. Before the movable arm 41 starts operation, the drying gas nozzle 30 is located at a position where the center of gravity of the collision range of the drying gas flow Gf is upstream of the rotation center Wc of the topside surface WA in the nozzle moving direction Dn. Thus, by moving of the movable arm 41, the center of gravity of the collision range passes through the center of rotation Wc.

As the movable arm 41 is moved from the rotation center Wc to the outer periphery of the substrate W while the rinse water flow Rf and the drying gas flow Gf are supplied to the topside surface WA, a boundary between the rinse water R and the drying gas G is spread gradually and concentrically, and a dried region on the topside surface WA is gradually enlarged. At this time, in the gas-liquid boundary, because the drying gas G is sprayed to the rinse water R, IPA of the drying gas G is dissolved into the rinse water R, which reduces surface tension of the rinse water R. A concentration of IPA dissolved in the rinse water R becomes lower as the rinse water R is away from a contact position to the drying gas flow Gf, so that the surface tension of the rinse water R includes a gradient which is lower on the upstream side and becomes gradually higher on the downstream side in the nozzle moving direction Dn. Due to this gradient of surface tension, a Marangoni force in which the rinse water R is drawn from the side with small surface tension to the side with large surface tension is acted. In addition to this, by rotation of the substrate W, a centrifugal force in which the rinse water R is drawn from the side of the rotation center Wc to the side of an outer periphery of the substrate W is exerted. By mutual interaction of these forces, the rinse water R is appropriately removed from the topside surface WA. According to the single wafer IPA drying described above, occurrence of inconveniences such as a watermark can be inhibited even to the hydrophobic topside surface WA and a drying process can be executed effectively. Additionally, it is understood that the single wafer IPA drying described above can be applied also to a hydrophilic surface.

When the movable arm 41 reaches the outer periphery of the substrate W, supply of the rinse water flow Rf and the drying gas flow Gf to the topside surface WA is stopped. At this time, the supply of the rinse water flow Rf to the topside surface WA is firstly stopped, and thereafter the supply of the drying gas flow Gf may be stopped. Following that, a rotation speed of the substrate W is raised (in this embodiment, it is raised to approximately 800 to 2000 rpm) to eliminate droplets remaining at an outer end portion (edge portion) and a rear surface of the substrate W by centrifugal force. The drying step is finished with this process, and after the rotation of the substrate W is stopped, the substrate W is delivered from the rotation mechanism 10.

Conventionally, in the single wafer IPA drying, an amount of IPA in a drying gas flow has been constant while the drying gas flow is moved from the rotation center of the substrate to approximately half of a radius of the substrate to try to reduce surface tension of rinse water as possible even in a portion adjacent to the rotation center of the substrate. Further, in a portion adjacent to the rotation center of the substrate having a small centrifugal force, from a viewpoint of further reducing surface tension of the rinse water, a moving speed of the nozzle to the outer periphery has been often reduced so that the rinse water contacts to the drying gas flow containing IPA for a relatively long time to increase IPA supplied to the rinse water. Moreover, regarding a rotation speed of the substrate, considering that centrifugal force becomes larger as it goes to the outer periphery of the substrate and a film of the rinse water tends to be formed, a rotation speed of the substrate is lowered when the rinse water flow is moved to the outer periphery of the substrate by an appropriate distance. Conventionally, by executing such various controls, occurrence of defects such as a watermark has been inhibited.

However, the inventors have found that, in accordance with recent miniaturization of a semiconductor apparatus or advancement of a semiconductor technology, verification in a smaller defect size is required, and when evaluation standard is more strict and an upper limit of the allowable defect is smaller, this more strict standard cannot be fulfilled with substrates subjected to a drying process by the conventional control. For example, in the substrate subjected to a drying process by the conventional control, even if a defect is not detected in a case where the defect size of 0.15 µm or more is targeted, this defect can be detected when the detection size of less than 0.15 µm, 0.10 µm for example, is targeted, and it is found that the huge numbers of defects are finally generated.

Recently, in the semiconductor substrate, copper with relatively less resistance has been used as a wiring material. The copper wiring is generally formed by forming a groove on an insulation film formed on a topside surface of a substrate, embedding copper in the groove, and then shaving redundant copper by CMP. For the insulation film in which the copper is embedded, a material whose k value (relative permittivity) is low (Low-k film) is used from a viewpoint of reducing condenser capacity formed between wiring. Typically, as a Low-k film is hydrophobic, a rinse water film on the substrate W tends to be divided in cleaning after polishing, and there is a possibility of occurrence of defects such as a watermark and a crack if drying is executed in a state that the rinse water film is divided. Currently, k value of a Low-k film (typically SiOC film) is approximately 3.0 or less, and this value is predicted to be 2.5 or less for a Low-k film to be applied in the future. Moreover, to reduce the k value, application of a Low-k film of pore configuration (porous) type is considered. In a pore type Low-k film, it is considered that substances tend to be accumulated in holes of a porous part.

Under the circumstances described above, as a result of earnest research, the inventors have found that occurrence of defects can be inhibited even with a more strict evaluation standard by the single wafer IPA drying with the following steps. Further, more preferably, according to the steps, processing capacity is improved rather than deteriorated. Prior to explanation of the steps, a region of the substrate W is divided for convenience in the order of drying performance.

Figure 10:
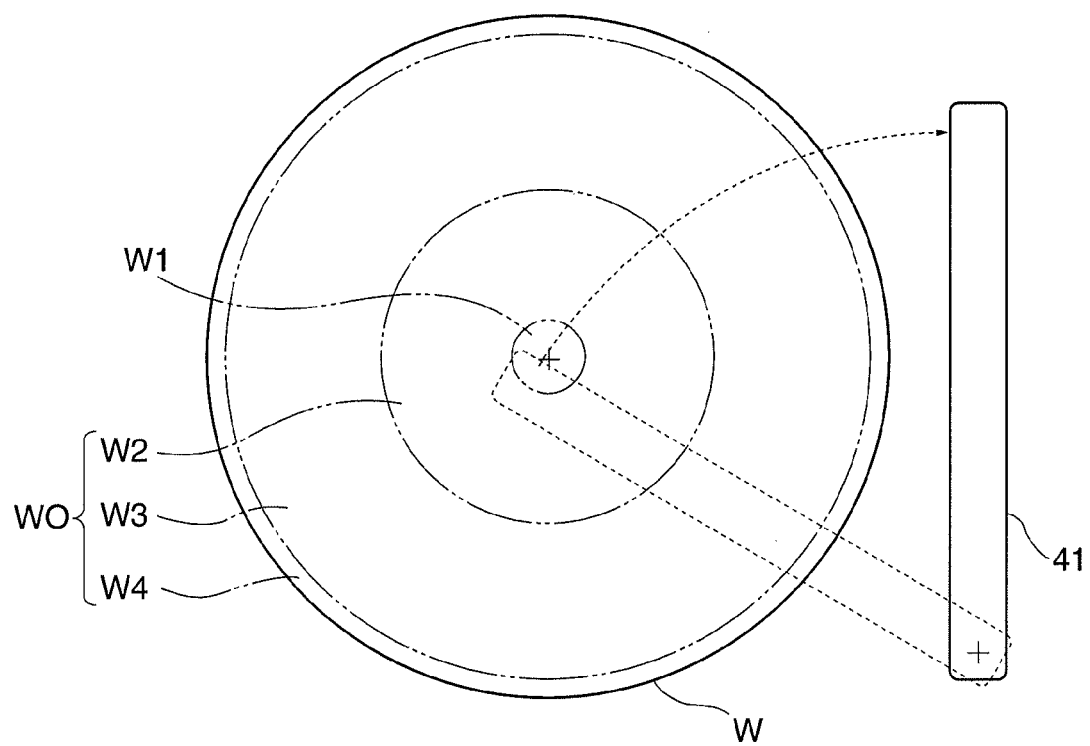
FIG. 10 is a plan view showing divided areas on a surface of the substrate.

FIG. 10 is a plan view showing divided areas on the topside surface WA of the substrate W. Firstly, the topside surface WA is divided into a center area W1 and an outer area WO. The center area W1 is a range in which the rotation center Wc of the substrate W exists in a collision range (a region in which the drying gas flow Gf collides with the topside surface WA). Typically, the center area W1 is a range within a virtual circle centered at the rotation center Wc and having a radius of the length of the diameter of the collision range. The outer area WO is a region outside of the center area W1. The outer area WO is further divided into an inner periphery area W2, an outer periphery area W3, and a peripheral end area W4 in the order from the side of the rotation center Wc toward the side of an outer peripheral end of the substrate W. The inner periphery area W2 is a range outside of the center area W1 and within a virtual circle centered at the rotation center Wc and having a radius of approximately a half of the radius of the substrate W. The outer periphery area W3 is a range outside of the inner periphery area W2 as well as inside of the peripheral end area W4. The peripheral end area W4 is outside of a trajectory in which a position of the drying gas flow Gf (see FIG. 8B) is rotated around the rotation center Wc in a state that the rinse water flow Rf and the drying gas flow Gf (see FIG. 8B) are moved in the radial direction of the substrate W (nozzle moving direction Dn) and they reach a position where supply of the rinse water flow Rf to the topside surface WA is stopped (typically, they reach the outer peripheral end).

Figure 11A:
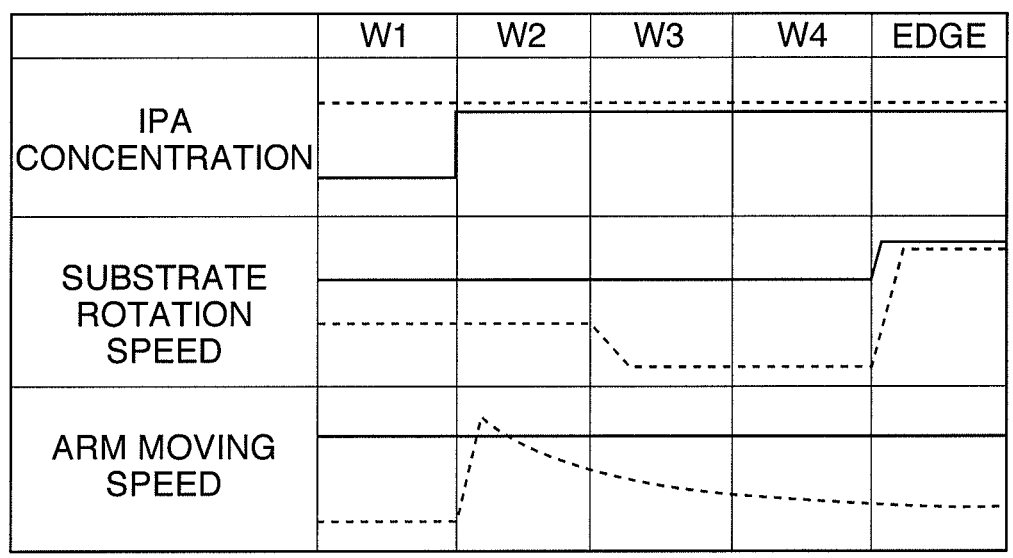
FIG. 11A is a time chart showing a change of IPA concentration in the drying gas flow, a change of a rotation speed of the substrate and a change of a moving speed of the movable arm in a substrate drying method according to the third embodiment of the present invention compared with the conventional example.
Figure 11B:
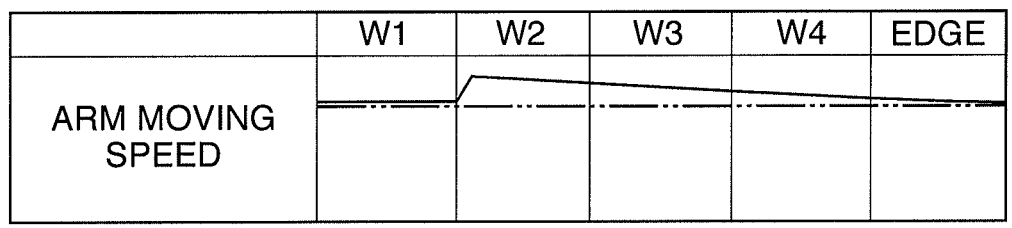
FIG. 11B is a drawing showing a variation of change of a moving speed of the movable arm in the substrate drying method according to the third embodiment of the present invention.

Next, with reference to FIGS. 11A and 11B, the single wafer IPA drying according to the third embodiment will be explained. FIG. 11A is a time chart showing variation of IPA concentration in the drying gas flow Gf, variation of a rotation speed of the substrate W and variation of a moving speed of the movable arm 41 in the single wafer IPA drying. The symbols W1 to W4 described in the horizontal axis show the areas of the topside surface WA which are divided for convenience. In FIGS. 11A and 11B, W1 to W4 are equally divided for easier understanding; however, this does not mean that the time required for drying each area is equal. In FIG. 11A, a solid line shows control of this embodiment, and a dashed line shows a representative example of the conventional control as a reference example. In the following explanation, FIGS. 8A, 8B and 10 are referred as needed.

First, control of IPA concentration of the drying gas flow Gf will be explained. In this embodiment, IPA concentration of the drying gas flow Gf is maintained to less than 2 mol % in a center area drying step for drying the center area W1, and the IPA concentration is higher than that in the center area drying step when the inner periphery area W2 to the peripheral end area W4 are dried. Here, mole fraction (mol %) is a ratio of an IPA amount of substance to a total amount of substance constituting the drying gas flow Gf containing IPA (IPA/drying gas flow Gf) in a flow rate of the drying gas flow Gf per unit time. The IPA concentration in the center area drying step may be 0 mol % (no IPA is contained). In this embodiment, the IPA concentration of the drying gas flow Gf is 0 mol % or more and less than 2 mol % (preferably less than 1 mol %) in the center area drying step depending on the situation, and it is a constant value of approximately 2 mol % or more which is higher than the IPA concentration in the center area W1 when the inner periphery area W2 to the peripheral end area W4 are dried. Additionally, during drying of the outer area WO, the IPA concentration of the drying gas flow Gf may be raised to approximately 20 mol % depending on the situation.

Figure 14:
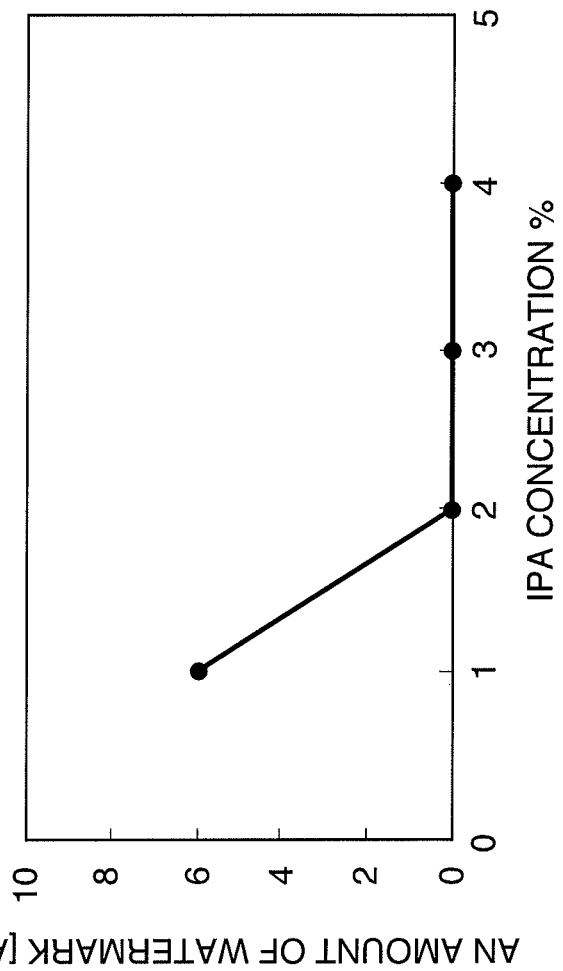
FIG. 14 is a graph showing the relationship between IPA concentration in the gas flow and an amount of occurrence of a watermark of 0.15 μm or more conventionally grasped.

By IPA concentration control as described above, in a case where a standard of extracting defects such as a watermark is 0.10 µm or more, the number of extracted defects is remarkably decreased compared with the case of the conventional control (an aspect shown by a dashed line in FIG. 11A). From this fact, the following cause is predicted. That is, IPA has a property that its viscosity becomes higher as the concentration increases to reach a predetermined concentration (generally approximately 60%). However, the conventional process in which IPA concentration in a drying gas flow is relatively high for reducing surface tension of rinse water has been conversely a cause of increasing the viscosity of the rinse water, and especially in the center area with a relatively small centrifugal force, it has been considered that the rinse water tends to remain on the substrate. So far, it has been recognized that a Marangoni effect appears with IPA concentration of 2 mol % or more in IPA drying, because generation of a watermark is rarely seen when IPA concentration is 2 mol % or more (see FIG. 14). However, this recognition is under the circumstance that the defect size of 0.15 µm or more is targeted, and in the third embodiment in which a defect of 0.10 µm is also targeted, it is presumed that inhibiting the increase of the viscosity of the rinse water R contributes more to inhibition of defect occurrence than generating a Marangoni effect, so that concentration of less than 2 mol % in which generation of the Marangoni effect is difficult to appear is set in the center area W1. Especially, in a pore type Low-k film whose future application is predicted, when rinse water R is filled in holes of a porous part, it tends to be accumulated in the holes even when its removal is tried by drying gas flow Gf, and if the rinse water R dissolving IPA remains in the holes, residue is possibly precipitated when the rinse water R is evaporated thereafter. (Additionally, FIG. 14 shows a result of single wafer IPA drying to a pattern wafer which is not pore type and whose k value is 2.9 with the condition of IPA concentration, a substrate rotating speed and an arm moving speed shown in dashed lines in FIG. 11A). Since IPA is an organic matter, it is conceivable that the residue of an organic matter tends to be precipitated after the rinse water is evaporated by the matter that the rinse water dissolving IPA remains on the topside surface WA.

The inventors focus on this point, and have found that the number of defects of the center area W1 is remarkably decreased by the matter that IPA in the drying gas flow Gf is less than 2 mol % (less than the concentration in which a Marangoni effect is represented) during the drying step of the center area W1. As a centrifugal force in a portion outside of the center area W1 is larger than that of the center area W1, a film thickness of the rinse water R covering the topside surface WA can be reduced by increasing IPA concentration in the drying gas flow Gf to reduce surface tension of the rinse water R, whereby a drying load is diminished. In addition, by means of mutual interaction between a Marangoni force and a centrifugal force, the rinse water R is effectively eliminated to achieve efficient drying. Additionally, the inventors have found that, when IPA concentration in the drying gas flow Gf is less than 2 mol % in the drying step of the center area, an effect of reduction of the number of defects can be achieved even when a rotation speed of the substrate W is not a low speed (for example, equal to or less than 100 rpm), but approximately 500 rpm for example. Accordingly, a rotation speed which is relatively high (for example, approximately 500 rpm) may be applied starting from the center area drying step and until drying of the peripheral end area W4 is completed.

Next, control of a rotation speed of the substrate W will be explained. In this embodiment, in a step of forming a film of the rinse water R (not shown in FIG. 11A) before the center area drying step, a rotation speed of the substrate W is raised to the same value as that in the center area drying step. The rotation speed of the substrate W to be raised before the drying is started is preferably 400 rpm or less, and it is 300 rpm in this embodiment. When a rotation speed of the substrate W reaches a predetermined speed (300 rpm in this embodiment), the center area drying step is started, and the rotation speed is maintained thereafter until drying of the peripheral end area W4 is completed. Especially in the outer periphery area W3 in which a liquid amount of the rinse water R per unit area tends to be insufficient, a rotation speed of the substrate W is preferably raised to inhibit turbulence of a surface of the rinse water R having a strong surface tension on a hydrophobic surface. Moreover, the inventors have recognized that the number of defects is not increased even when a rapid rotation (for example, 500 rpm) of the substrate W is executed in the center area W1 with IPA concentration is less than 2 mol %. In this embodiment, as IPA concentration of the drying gas flow Gf is less than 2 mol % in the center area drying step, IPA residue is rarely precipitated. This allows a relatively high rotation speed of the substrate W, and drying in a relatively high rotation speed can be executed starting from the center area drying step till drying of the peripheral end area W4. Consequently, a film of the rinse water R can be thinned compared with the conventional process and a drying load is diminished.

In the conventional single wafer IPA drying, a rotation speed of the substrate was a relatively low (for example, 100 rpm) from the beginning. Nevertheless, considering that a surface area to be dried per unit length in a radial direction is increased as it goes to the outer periphery of the substrate, the rotation speed was further decreased when the drying gas flow reaches approximately a half of the radius of the substrate. Typically, the rotation speed of the substrate was lowered in moving from the inner periphery area W2 to the outer periphery area W3 divided for convenience. However, the inventors have found that the number of defects is possibly increased if a rotation speed of the substrate is lowered in the single wafer IPA drying. This possibility is remarkable especially in a strict evaluation standard. This is because, presumably, under the circumstance that surface tension and centrifugal force are balanced by a substrate rotation speed maintained at an initial speed, the centrifugal force is reduced by lowering the rotation speed and the surface tension becomes relatively large, which makes a film of the rinse water thick to disturb a surface of the film of the rinse water and an uneven drying could occur. This suggests that an effect of inhibiting occurrence of defects is limited if a surface of the film of the rinse water is disturbed in the single wafer IPA drying.

On the other hand, a rotation speed of the substrate W may be increased during the single wafer IPA drying. Increase of the rotation speed of the substrate W operates in the direction to increasing centrifugal force acting on the rinse water R, which is the direction to making the film of the rinse water thin. Thus, the possibility that a surface of the film of the rinse water R is disturbed is presumably low. When the rotation speed of the substrate W is increased, in accordance with that a moving speed of the movable arm 41 can be increased, thereby improving throughput. In a case where the rotation speed of the substrate W is increased, the timing of increasing the rotation speed is desirably the time when moving from the inner periphery area W2 to the outer periphery area W3 is executed. In addition, acceleration in increasing the rotation speed of the substrate W is preferably 50 rpm or less per second from a viewpoint of inhibiting turbulence of the surface of the film of the rinse water R. For example, in moving from the inner periphery area W2 to the outer periphery area W3, the rotation speed of the substrate W may be increased to 400 rpm with acceleration of 50 rpm per second. Further, increase of the rotation speed of the substrate W is also permitted during drying of the peripheral end area W4. At this time, an upper limit of the rotation speed can be the maximum value of capability of the apparatus; however, from a viewpoint of inhibiting disturbance of the film of the rinse water, the acceleration is preferably a predetermined value (for example, 50 rpm per second) or less.

Next, variation of a moving speed of the movable arm 41 will be explained. In this embodiment, after completion of the step of forming a film of the rinse water R on a surface (not shown in FIG. 11A) before the center area drying step, supply of the drying gas flow Gf to the topside surface WA is started, and then the movable arm 41 starts moving maintaining a constant moving speed to the peripheral end W4. In other words, a moving speed of the movable arm 41 does not change from the center area W1 to the peripheral end area W4. The inventors have found that, if variation of a moving speed of the movable arm 41 during the drying step is large, a surface of the film of the rinse water R is disturbed at a speed switching portion and occurrence of defects tends to increase. Thus, the occurrence of defects can be inhibited by preventing variation of a moving speed of the movable arm 41. Moreover, a moving speed of the movable arm 41 can be set to be larger than that of the conventional apparatus by preventing the rinse water R dissolving IPA from remaining in the center area W1 which is caused by viscosity of the IPA, because IPA concentration in the drying gas flow Gf during the center area drying step is less than 2 mol %. The higher the moving speed of the movable arm 41 is, the more excellent drying process capability becomes, which contributes to improvement of throughput. In this embodiment, the moving speed of the movable arm 41 is 3 mm/sec or higher against the conventional moving speed of approximately 2 mm/sec or lower (for example, 1 mm/sec).

Additionally, a moving speed of the movable arm 41 may be increased in a predetermined range immediately after completion of the center area drying step as shown in FIG. 11B, or although it is not shown in FIGS. 11A and 11B, until the time when the center area drying step is just completed including the time for the center area drying step. Here, the predetermined range is a range in which the single wafer IPA drying is executed appropriately. Here, a two-dot chain line in FIG. 11B corresponds to a solid line in FIG. 11A. In the center area W1, as there is little centrifugal force, a moving speed of the movable arm 41 is preferably approximately κ mm/sec or less, while in the inner periphery area W2 in which a centrifugal force that contributes to operation allowing the rinse water R to move to the outer periphery side is generated cooperating with surface tension, a surface area per unit length in the radial direction of the substrate W is smaller than that of the peripheral end area W4, so that there is room for increasing a moving speed of the movable arm 41. Defects tend to occur if a moving speed of the movable arm 41 is changed in the middle of drying of the outer area WO; however, they seldom occur if the moving speed of the movable arm 41 is changed by the time immediately after completion of the center area drying step. By increasing a moving speed of the movable arm 41 as described above, throughput can be improved. In a case where a moving speed of the movable arm 41 is changed by the time immediately after completion of the center area drying step, considering that a surface area to be dried per unit moving distance becomes larger as the movable arm 41 approaches to the peripheral end area W4, as shown in FIG. 11B, it is preferable to decrease the moving speed of the movable arm 41 gradually so that the movable arm 41 reaches the peripheral end area W4 with a moving speed in the center area drying step.

Additionally, the technology of increasing a moving speed of the movable arm 41 by the time immediately after completion of the center area drying step can be applied to the case other than the case where IPA concentration in the drying gas flow Gf is less than 2 mol %. In application to the case where IPA concentration in the center area drying step is 2 mol % or more, if a moving speed of the movable arm 41 in the center area drying step is less than 2 mm/sec which is equal to the conventional apparatus, increase of occurrence of defects can be inhibited.

As described above, according to the substrate drying method in accordance with this embodiment, occurrence of defects can be inhibited without increasing the processing time even when an evaluation standard is made strict. In other words, throughput is not deteriorated (or improved) while improving performance. Especially, the matter that IPA concentration in the drying gas flow Gf in the center area drying step is less than 2 mol % (less than a concentration in which a Marangoni effect is represented) contributes to inhibition of defect occurrence in the center area W1. The matter that a rotation speed of the substrate is not changed from drying of the center area W1 to drying of the peripheral end area W4, or it is increased within a predetermined range when the drying is moved from the inner periphery area W2 to the outer periphery area W3 or from the outer periphery area W3 to the peripheral end area W4, contributes to inhibition of defect occurrence in the outer area WO. The matter that a moving speed of the movable arm 41 is increased contributes to improvement of throughput.

Figure 12A:
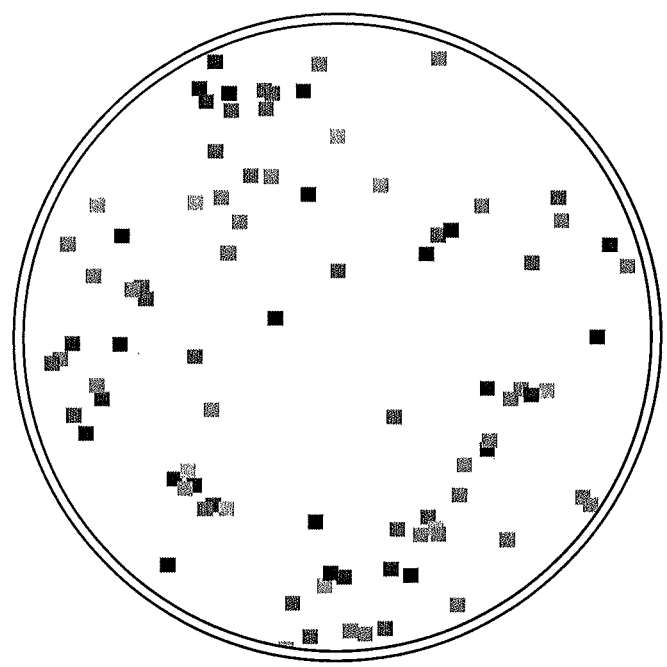
FIG. 12A is a drawing showing a state of defects detected after a drying process is executed by the substrate drying method according to the third embodiment of the present invention.
Figure 12B:
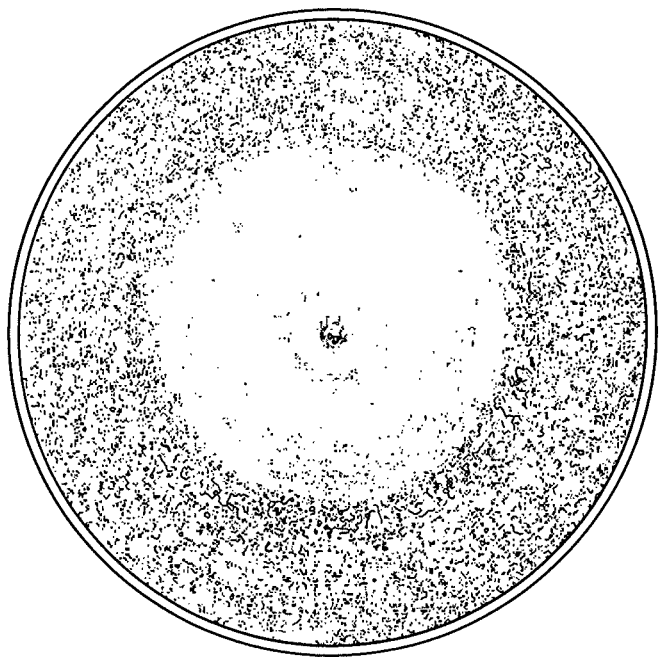
FIG. 12B is a drawing showing a state of defects detected after a drying process is executed by the conventional drying method.

FIGS. 12A and 12B show a state of defects detected after the drying process. FIG. 12A is a drawing showing a result of a processing according to a substrate drying method (recipe) of this embodiment, and FIG. 12B is a drawing showing a result of a processing according to the conventional substrate drying method (recipe). IPA concentration of the drying gas flow Gf, a rotation speed of the substrate W and variation of a moving speed of the movable arm 41 in these figures are as shown in FIG. 11A. Additionally, to obtain results shown in FIGS. 12A and 12B, a silicone substrate in which a pore type SiOC film with k value of 2.5 is formed on the topside surface WA (a blanket wafer which is generally regarded as one in which cleaning with no defect is more difficult than in a pattern wafer) is used as the substrate W, pure water is used as the rinse water R and nitrogen gas mixed with IPA is used as the drying gas flow Gf. IPA concentration in the drying gas flow Gf which has obtained a result of FIG. 12A is 1 mol % or less in the center area W1, and 3 to 4 mol % in the outer area WO. Moreover, a rotation speed of the substrate W which has obtained a result of FIG. 12A is constant from the center area W1 to the peripheral end area W4. Then, after completion of each drying process according to both recipes, a defect detecting apparatus which detects a desired-sized defect using a UV laser was used to detect the number of defects with the size of 0.10 μm or larger. Additionally, the defects shown in FIGS. 12A and 12B include cleaning residues, scars on a surface of the substrate, and watermarks. In addition, the size of the defects in FIG. 12A is shown larger than that of FIG. 12B; however, this is merely for convenience to grasp the result, and practically, the size of the defects detected in each of the figures (defects of 0.10 μm or more are targeted) is the same as the other.

As shown in FIGS. 12A and 12B, in a result processed by the recipe according to this embodiment shown in FIG. 12A, the defects are not concentrated in a specific place and only scattered, while in a result processed by the conventional recipe shown in FIG. 12B, a number of defects are detected in the center area W1, the outer periphery area W3 and peripheral end area W4. In addition, after repeated experiments, the number of defects detected by the defect detecting apparatus was stable as less than 200 in results processed by the recipe according to this embodiment as shown in FIG. 12A, while it was varied as several thousands to several tens of thousands values (less than thirty thousand) in results processed by the conventional recipe as shown in FIG. 12B. Such experimental results are not solitary verification results, but supported by the dozens of times of implementation experience. In this way, according to the recipe in accordance with this embodiment, it is confirmed that a remarkably excellent effect of significantly reducing the number of defects to be detected to approximately ¹⁄₁₄₀ is provided when the evaluation standard is made strict.

In the above explanation, the substrate W has the disk shape; however, the shape other than circular such as quadrilateral may be applied, that is, any shape may be applied as long as the rotation center is included and drying can be executed by rotation. Moreover, the substrate W is generally a semiconductor substrate formed by silicone; however, this drying method can be applied to substrate other than a silicone substrate such as a quartz substrate.

In the above explanation, the movement mechanism 40 functions as both the rinse agent nozzle movement mechanism and the drying gas nozzle movement mechanism. However, the rinse agent nozzle movement mechanism and the drying gas nozzle movement mechanism may be configured separately.

In the above explanation, the rotation mechanism 10 holds the substrate W with the chuck claws 11. However, the substrate W may be held with a roller chuck.

In the above explanation, IPA concentration is less than 2 mol % (less than a concentration in which a Marangoni effect is represented) in the center area drying step, and the IPA concentration is increased to one in which a Marangoni effect can be obtained in the step other than the center area drying step. However, there is a case that occurrence of defects is inhibited also while the inner periphery area W2 is dried even when the IPA concentration is the same as that in the center area drying step. In such a case, the IPA concentration may be maintained to less than 2 mol % while the center area W1 and the inner periphery area W2 are dried.

In a case where the IPA concentration in the drying gas G is less than 2 mol % (less than a concentration in which a Marangoni effect is represented) while the inner periphery area W2 is dried, if the IPA concentration of the drying gas G is rapidly increased when a region of the substrate W to be dried is moved from the inner periphery area W2 to the outer periphery area W3, defects could occur at a portion in which the IPA concentration is rapidly increased. In such a case, the IPA concentration may be gradually increased as the region of the substrate W to be dried is spread toward a boundary between the inner periphery area W2 to the outer periphery area W3.

Figure 13A:
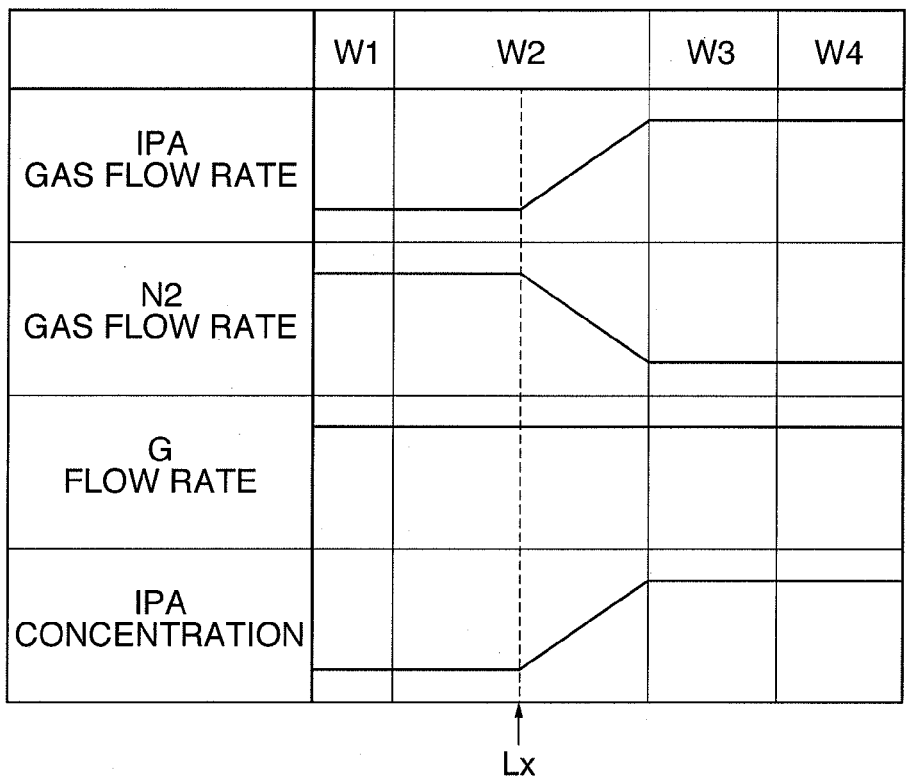
FIG. 13A is a time chart showing changes of a gas flow rate and IPA concentration in the drying gas in the substrate drying method according to a variation of the third embodiment of the present invention.
Figure 13B:
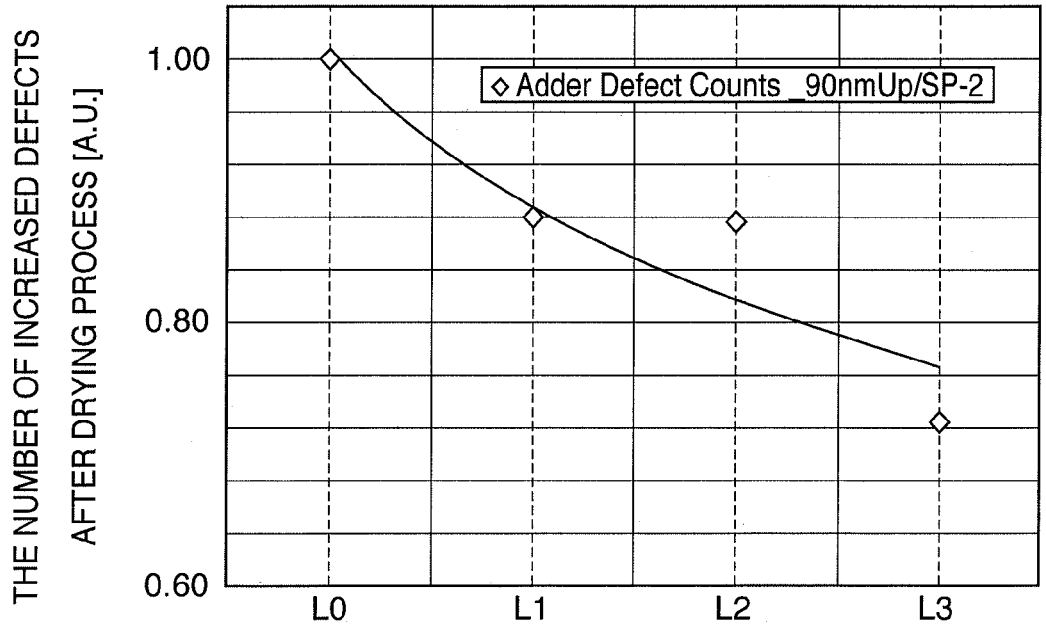
FIG. 13B is a graph showing the relationship between a starting point of IPA concentration variation and occurrence status of defects in the method shown in FIG. 13A.

FIG. 13A is a time chart showing variation of a flow rate in each gas and IPA concentration of the drying gas G in a method of gradually increasing IPA concentration of the drying gas G toward a boundary between the inner periphery area W2 and the outer periphery area W3 which is the substrate drying method according to the third embodiment, and FIG. 13B is a graph showing the relationship between a starting point of IPA concentration variation and a state of defect occurrence (the number of increased defects of 90 nm or more is measured by SP-2 (product by KLA-Tencor Corp.)) in the method show in FIG. 13A. In the method shown in FIG. 13A, the drying gas G is prepared by mixing IPA gas (IPA vapor) with nitrogen gas N2. In this embodiment, IPA concentration of the drying gas G is 0.2 mol % in the center area W1, and 4 mol % in the outer periphery area W3 and the following areas. In the inner periphery area W2, IPA concentration is proportionally increased from a position Lx such that IPA concentration is 4 mol % at a boundary between the inner periphery area W2 and the outer periphery area W3 (hereinafter, referred to as "inner and outer area boundary"). In this embodiment, a flow rate of the nitrogen gas N2 and the IPA gas are distributed without changing the flow rate of the drying gas G so that IPA concentration in the drying gas G obtains such concentration.

The position Lx in which increase of IPA concentration in the drying gas G is started is a predetermined position which is located toward the rotation center Wc from the inner and outer area boundary in the radial direction of the substrate W. The inventors have found that variation of the position Lx affects the number of defects occurring after the drying process of the substrate W, and have executed the substrate drying method shown in FIG. 13A in several patterns with variation of the position Lx. FIG. 13B shows the results. In FIG. 13B, the number of increased defects with respect to a position L0 is a result when a starting point of increase of IPA concentration in the drying gas G (hereinafter, referred to as "a concentration increase starting point") is the inner and outer area boundary, that is, the IPA concentration is rapidly increased at the inner and outer area boundary. The number of increased defects with respect to a position L1 is a result when the concentration increase starting point is moved toward the rotation center Wc by 5 mm from the inner and outer area boundary. The number of increased defects with respect to a position L2 is a result when the concentration increase starting point is moved toward the rotation center Wc by 10 mm from the inner and outer area boundary. The number of increased defects with respect to a position L3 is a result when the concentration increase starting point is moved toward the rotation center Wc by 30 mm from the inner and outer area boundary. The rate of increase (inclination) in the IPA concentration of the region to be dried of the substrate W per unit moving distance becomes smaller in the order of the position L1, the position L2 and the position L3. When the concentration increase starting point is the position L0, a drying method is different from the method of proportionally increasing IPA concentration shown in FIG. 13A. However, this method is shown for convenience of comparison with the positions L1, L2 and L3, and applied as a reference.

As shown in FIG. 13B, assuming that the number of increased defects after the drying process is 1.00 when the concentration increase starting point is the position L0, the number of defects after the drying process is 0.88 when the concentration increase starting point is the position L1, the number of defects after the drying process is also 0.88 when the concentration increase starting point is the position L2, and the number of defects after the drying process is 0.72 when the concentration increase starting point is the position L3. Here, "A.U." represents Arbitrary Unit. This result shows that IPA concentration of the drying gas G is preferably varied in a relatively slow speed (with a predetermined inclination). From this fact, the following cause is presumed. That is, based on the fact that variation of IPA concentration in the drying gas G changes surface tension of the rinse water R which contacts to the drying gas G, a drying state of the substrate W can be stable by changing the surface tension of the rinse water R not rapidly but gradually, which further inhibits occurrence of defects. In this embodiment, IPA concentration in the drying gas G is proportionally increased from the position Lx. However, in view of the finding that it is preferable to gradually vary the surface tension of the rinse water R described above, various increasing methods, for example, increasing in an exponential manner can be applied within a range that allows the variation of the surface tension of the rinse water R. Such increase is included in "increasing gradually."

Additionally, in the above explanation, an outer end of the inner periphery area W2 is an outer periphery of a virtual circle centered at the rotation center Wc of the substrate W with a radius which is a half of the radius of the substrate W. However, the outer end of the inner periphery area W2 may be appropriately set according to a state of a position in which a Marangoni effect is desired to be exerted. For example, irrespective of the size of the substrate W (the diameter of 300 mm, 450 mm and the like), an outer end of the inner periphery area W2 may be the outer periphery of a virtual circle centered at the rotation center Wc of the substrate W with a radius of 110 mm. At this time, the concentration increase starting point is displaced toward the rotation center Wc based on the inner and outer area boundary set depending on the situation.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS 1, 2, 2A and 3: substrate drying apparatus
10: rotation mechanism
20: rinse water nozzle (rinse agent nozzle)
30: drying gas nozzle
36: additional drying gas nozzle
40: movement mechanism
50: controller
Dn: nozzle moving direction
Dr: substrate rotation direction
Gf: drying gas flow
Gft, Gst: a range that substantially exerts an effect of drying gas on rinse water
Gfv, Gsv: a discharge position of a drying gas flow from a drying gas nozzle
Gfw, Gsw: a collision position of a drying gas flow with the substrate
R: rinse water (rinse agent)
Rf: rinse water flow (rinse agent flow)
Rt: a rinse water collision range Rt (rinse agent collision range)
W: substrate
WA: topside surface
Wc: rotation center
Wp: vertical line
W1: center area
W3: outer periphery area
α: inclined angle
β: turning angle
θ: contact angle

What is claimed is:

1. A method for drying a surface of a substrate using a Marangoni effect, the substrate having micro-sized electric circuits in a surface of the substrate, the method comprising:
providing the substrate having micro-sized electric circuits in the surface of the substrate,
holding the substrate in a rotatable bracket horizontally,
rotating the rotatable bracket with the substrate,
supplying a rinse liquid from a first nozzle to the surface of the rotating substrate at a position which is central to the rotating substrate so that the surface of the rotating substrate is covered with the rinse liquid,
supplying a gas including an Isopropyl Alcohol from a second nozzle to a surface of the rinse liquid on the surface of the rotating substrate at a position that is central to the rotating substrate, and
moving the position where the gas is supplied to the surface of the rinse liquid radially outwardly toward a peripheral portion of the substrate from the position that is central to the rotating substrate while supplying a rinse liquid to a position radially outside of the position where the gas is supplied to the surface of the rinse liquid so that at least a part of the rinse liquid and at least a part of the Isopropyl Alcohol on the surface of the substrate mix together and generate the Marangoni effect, and by combining with a centrifugal force thus removing the rinse liquid from the position that is central to the rotating substrate to the peripheral portion of the substrate to dry the surface of the substrate,
wherein:
a density of the Isopropyl Alcohol in the gas supplied to an area within a circle having a radius which is the same as an inner diameter of the second nozzle and including a rotation center is below 2 mol %, and
a density of the Isopropyl Alcohol in the gas supplied to an area outside of a circle having a radius of a half of a radius of the substrate is equal to or more than 2 mol %.

2. The method according to claim 1, wherein the density of the Isopropyl Alcohol in the gas supplied to the area within the circle having the radius which is the same as the inner diameter of the second nozzle and including the rotation center is below 1 mol %.

3. The method according to claim 1, wherein the density of the Isopropyl Alcohol in the gas supplied to the area outside of the circle having the radius of the half of the radius of the substrate is in a range of from 3 to 4 mol %.

4. The method according to claim 1, wherein the density of the Isopropyl Alcohol in the gas supplied to the area within the circle having the radius which is the same as the inner diameter of the second nozzle and including the rotation center is zero mol %.

5. The method according to claim 1, wherein the density of the Isopropyl Alcohol in the gas supplied to the area outside of the circle having the radius of the half of the radius of the substrate is in a range of from 4 to 20 mol %.

6. The method according to claim 1, wherein the micro-sized electric circuits have insulators with micropores.

7. The method according to claim 1, wherein a moving speed of the step of moving the position where the gas is supplied to the surface of the rinse liquid radially outwardly toward the peripheral portion of the substrate from the position that is central to the rotating substrate is constant.

8. The method according to claim 1, wherein the gas is an inert gas.

9. The method according to claim 1, wherein the surface of the substrate is a polished surface polished with chemical mechanical polishing.

10. The method according to claim 1, wherein a contact angle of the surface of the substrate to the rinse liquid is below 90 degrees and an angle of the second nozzle in a vertical plane to the surface of the substrate is in a range from 90 degrees minus a half of the contact angle to the half of the contact angle.

11. The method according to claim 1, wherein the density of the Isopropyl Alcohol in the gas supplied increases with radial position in the area from the circle having the radius which is the same as the inner diameter of the second nozzle to the circle having the radius of the half of the radius of the substrate.

12. The method according to claim 1, wherein the gas supplied from the second nozzle reaches the surface of the substrate with a diameter substantially identical to the inner diameter of the second nozzle.

13. The method according to claim 1, wherein the inner diameter of the second nozzle is 3 mm to 10 mm.

14. An apparatus for drying a surface of a substrate using a Marangoni effect, the substrate having micro-sized electric circuits in a surface of the substrate, the apparatus comprising:
a rotatable bracket for holding the substrate and rotating the substrate horizontally,
a nozzle device having a first nozzle for supplying a rinse liquid to the surface of the rotating substrate and a second nozzle for supplying a gas including an Isopropyl Alcohol to the surface of the rotating substrate,
an arm device for supporting the nozzle device above the substrate and for moving the nozzle device from a position that is central to the rotating substrate radially outwardly toward a peripheral portion of the substrate,
a controller for controlling movement of the arm device and a density of the Isopropyl Alcohol in the gas so that:
the rinse liquid is supplied to the position that is central to the rotating substrate from the first nozzle to cover the surface of the substrate with the rinse liquid,
then the gas is supplied to a surface of the rinse liquid on the surface of the substrate from the second nozzle at the position that is central to the rotating substrate while a rinse liquid is supplied from the first nozzle at a position radially outside of the position where the gas is to be supplied to the surface of the rinse liquid to result in at least a part of the rinse liquid and at least a part of the Isopropyl Alcohol on the surface of the substrate being mixed together, and
the position where the gas is to be supplied to the surface of the rinse liquid and the position where the rinse liquid is to be supplied to the surface of the substrate are moved from the position central to the rotating substrate radially outwardly toward the peripheral portion of the substrate to dry the surface of the substrate from the position central to the rotating substrate to the peripheral portion of the substrate with a combination of the Marangoni effect and a centrifugal force by rotation of the substrate, wherein:
a density of the Isopropyl Alcohol in the gas supplied at an area within a circle having a radius which is the same as an inner diameter of the second nozzle and including a rotation center is below 2 mol %, and
a density of the Isopropyl Alcohol in the gas supplied to an area outside of a circle having a radius of a half of a radius of the substrate is equal to or more than 2 mol %.

15. The apparatus according to claim 14, wherein the density of the Isopropyl Alcohol in the gas supplied to the area within the circle having the radius which is the same as the inner diameter of the second nozzle and including the rotation center is below 1 mol %.

16. The apparatus according to claim 14, wherein the density of the Isopropyl Alcohol in the gas supplied to the area outside of the circle having the radius of the half of the radius of the substrate is in a range of from 3 to 4 mol %.

17. The apparatus according to claim 14, wherein the density of the Isopropyl Alcohol in the gas supplied to the area within the circle having the radius which is the same as the inner diameter of the second nozzle and including the rotation center is zero mol %.

18. The apparatus according to claim 14, wherein the density of the Isopropyl Alcohol in the gas supplied to the area outside of the circle having the radius of the half of the radius of the substrate is in a range of from 4 to 20 mol %.

19. The apparatus according to claim 14, wherein the micro-sized electric circuits have insulators with micropores.

20. The apparatus according to claim 14, wherein the controller controls a moving speed of the arm device so that the position where the gas is supplied to the surface of the rinse liquid is moved constantly from the position central to the rotating substrate to the peripheral portion of the substrate.

21. The apparatus according to claim 14, wherein the gas is an inert gas.

22. The apparatus according to claim 14, wherein the surface of the substrate is a polished surface polished with chemical mechanical polishing.

23. The apparatus according to claim 14, wherein a contact angle of the surface of the substrate to the rinse liquid is below 90 degrees, and an angle of the second nozzle in a vertical plane to the surface of the substrate is in a range from 90 degrees minus a half of the contact angle to the half of the contact angle.

24. The apparatus according to claim 14, wherein the controller controls the density of the Isopropyl Alcohol in the gas so that the density of the Isopropyl Alcohol in the gas supplied increases with radial position in the area from the circle having the radius which is the same as the inner diameter of the second nozzle to the circle having the radius of the half of the radius of the substrate.

25. The apparatus according to claim 14, wherein the gas supplied from the second nozzle reaches the surface of the substrate with a diameter substantially identical to the inner diameter of the second nozzle.

26. The apparatus according to claim 14, wherein the inner diameter of the second nozzle is 3 mm to 10 mm.

* * * * *